(12) United States Patent
Whitman-Allen et al.

(10) Patent No.: US 11,442,283 B1
(45) Date of Patent: Sep. 13, 2022

(54) EYE SAFE LIGHT SOURCE PACKAGE

(71) Applicant: Amazon Technologies, Inc., Seattle, WA (US)

(72) Inventors: Zachary Whitman-Allen, Sunnyvale, CA (US); Xiaodong Xun, Pleasanton, CA (US)

(73) Assignee: Amazon Technologies, Inc., Seattle, WA (US)

( * ) Notice: Subject to any disclaimer, the term of this patent is extended or adjusted under 35 U.S.C. 154(b) by 718 days.

(21) Appl. No.: 16/029,359

(22) Filed: Jul. 6, 2018

(51) Int. Cl.
*G02B 27/20* (2006.01)
*H01S 5/183* (2006.01)
*H01S 5/42* (2006.01)

(52) U.S. Cl.
CPC .......... *G02B 27/20* (2013.01); *H01S 5/18305* (2013.01); *H01S 5/18355* (2013.01); *H01S 5/18369* (2013.01); *H01S 5/18388* (2013.01); *H01S 5/18394* (2013.01); *H01S 5/426* (2013.01)

(58) Field of Classification Search
CPC . G02B 27/20; H01S 5/18305; H01S 5/18355; H01S 5/18369
USPC .......................................................... 353/98
See application file for complete search history.

(56) References Cited

U.S. PATENT DOCUMENTS

| | | | |
|---|---|---|---|
| 8,120,281 B2 * | 2/2012 | Reuter ...................... | G02F 1/29 315/307 |
| 2004/0225474 A1 * | 11/2004 | Goldfine ............ | G05B 23/0245 702/183 |
| 2009/0141252 A1 * | 6/2009 | Kamijima .......... | G03B 21/2033 353/85 |
| 2020/0004037 A1 * | 1/2020 | Bai .................... | G03B 21/2033 |

* cited by examiner

*Primary Examiner* — Jerry L Brooks
(74) *Attorney, Agent, or Firm* — Kilpatrick Townsend & Stockton LLP

(57) ABSTRACT

Techniques for reducing the risk for an unsafe eye condition associated with light sources. In an example, a light source package is described. The light source package includes a package body defining an interior volume and including an opening. The package also includes a light source contained inside the interior volume of the package body. The package also includes an optical element that occupies at least a portion of the opening of the package body. An electrically conductive material is disposed over a surface of the optical element. This material may be electrically coupled with a system. The system accesses an electrical parameter of the material, determines a damage associated with the optical element based on the electrical parameter, and initiates a corrective action associated with the light source based on the damage.

20 Claims, 23 Drawing Sheets

EYE SAFE LIGHT SOURCE PACKAGE

BACKGROUND

A laser diode emits light having spatial and temporal coherence. A vertical-cavity surface-emitting laser (VCSEL) is a type of laser diode with laser beam emission perpendicular from the top surface. VCSELs can be fabricated in one-dimensional and two-dimensional arrays. Many user-related applications take advantage of laser arrays for depth sensing, shape sensing, laser scanning, and augmented reality. Despite the progress in the laser technology, light emitted by laser devices can be dangerous to the eyes.

BRIEF DESCRIPTION OF THE DRAWINGS

Various embodiments in accordance with the present disclosure will be described with reference to the drawings, in which.

DETAILED DESCRIPTION

Figure 1:
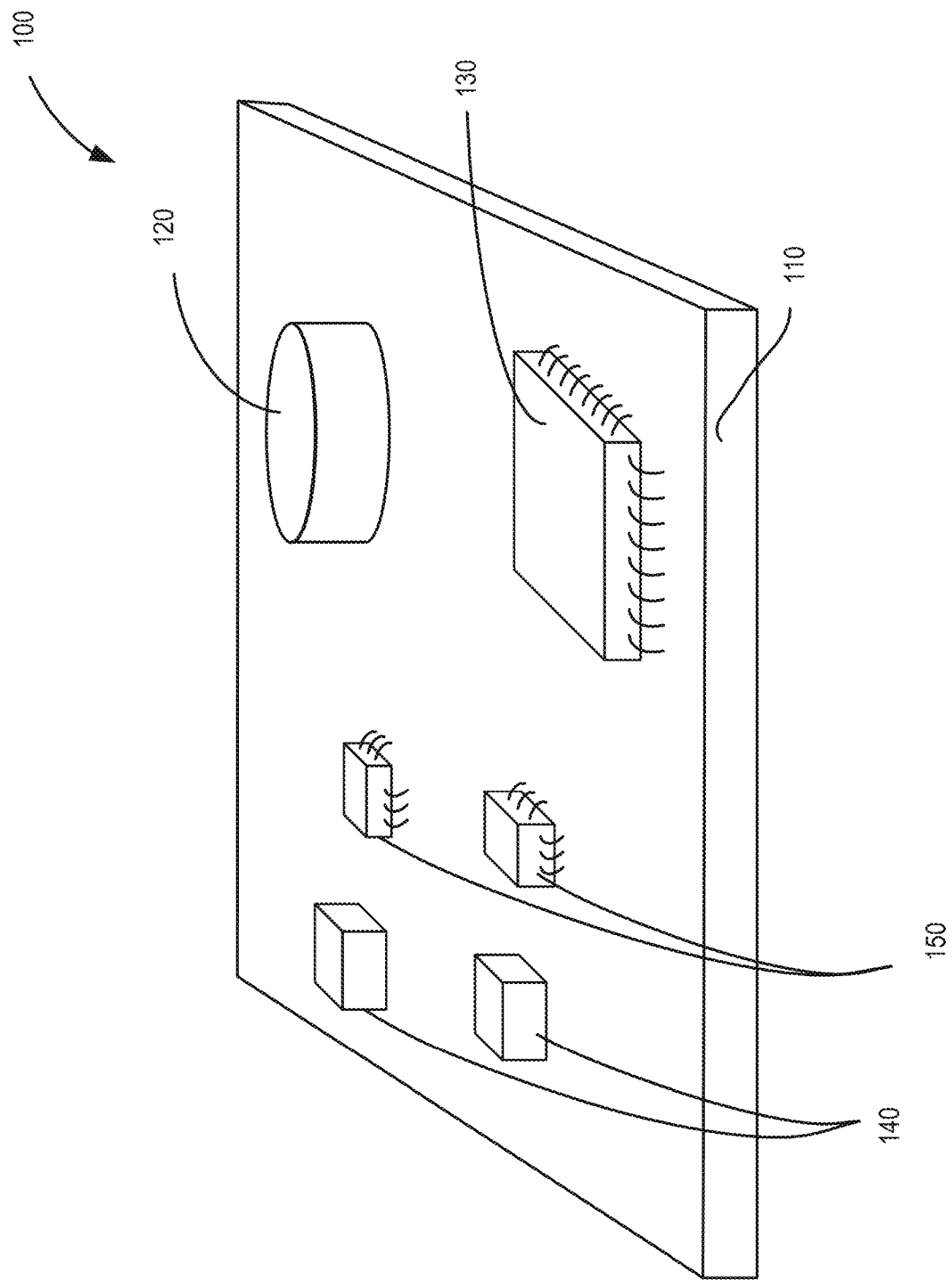
FIG. 1 illustrates an example of an optical projection system.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Embodiments of the present disclosure are directed to, among other things, reducing the risk for an unsafe eye condition associated with light sources, such as laser diodes. Given the coherence and collimation of light emitted from a light source (e.g., from a laser diode), a risk exists for an unsafe eye condition in user-related applications that rely on the light.

Common techniques for reducing this risk include spreading out the light before reaching an eye, thereby dispersing the optical power over a greater area. An optical element (e.g., a diffuser, a diffractive optical element (DOE)) positioned between the light source and the eye is a common technique for spreading out the light. However, the risk may still exist if damage to the optical element exists. For instance, a wide enough crack in the optical element may result in a focused light beam that may reach the eye. For instance, physical defects larger than one fourth of the light's wavelength would affect a DOE's diffractive optical structure. Embodiments of the present disclosure reduce the risk for an unsafe eye condition by monitoring changes to the optical element based on an electrical parameter of an electrically conductive material disposed over the surface of the optical element.

In an example, a light source package may be mounted on a substrate and may enclose a light source and an optical element. Light emitted from the light source is dispersed outwardly from this package through the optical element. The optical element may have an electrically conductive material that is disposed over one of its surfaces (e.g., on an external surface of the optical element such as the surface from which the light is dispersed outwardly) and that is transparent to the light. The light source and the electrically conductive material may be electrically coupled to a controller also mounted on the substrate. The controller may monitor an electrical parameter of the electrically conductive material, such as its resistance. Based on the electrical parameter, the controller may detect a damage to the optical element, where this damage may result in an unsafe eye condition. Accordingly, the controller may initiate a corrective action to mitigate this risk by, for instance, controlling the operations of the light source (e.g., turning off power to the light source, decreasing the light intensity by reducing an amount of power supplied to the light source, generating a fault report, etc.).

To illustrate, a light source package includes a VCSEL array, a diffuser, and an indium tin oxide (ITO) layer disposed over the external surface of the diffuser. Terminal plating connects the ITO layer to electrical connection points of the light source package. These electrical connection points are soldered to a printed circuit board (PCB). A power supply on the PCB provides current to the ITO layer. This current is measured and converted to a voltage. A controller on the PCB samples the voltage and determines whether a damage to the diffuser exists based on the sampled voltage. For instance, the voltage dropping to zero may indicate that the diffuser was likely removed from the light source package. The voltage changing to a level (other than zero) outside of an operational voltage range may indicate that a crack or a scratch in the diffuser likely exists. The determination of the damage may be confirmed by relying on a second electrical parameter from a second source (e.g., from a photodiode or a second ITO layer of a second optical element contained in the light source package), as further described in connection with the next figures. If the damage (or the potential thereof) is detected, the controller may turn off the VCSEL array to avoid the risk of an unsafe eye condition.

Embodiments of the present disclosure provide technical advantages over existing techniques for reducing the risk for an unsafe eye condition. In particular, the embodiments may allow the detection of a damage (or the potential of a damage) by monitoring the electrical parameter of the electrically conductive material. This monitoring may be performed to identify possible manufacturing defects and/or assembly issues that may not have been otherwise detected with a visual or other type of inspection of a light source package or an optical projection system that includes such a package. Furthermore, this monitoring may be performed during the operational use of the light source package or optical projection system. Hence, damage caused by the handling, use, aging, temperature stress, vibration, etc. can be detected at any time and the proper corrective action may be initiated to avoid the unsafe eye condition that can result from the damage.

FIG. 1 illustrates an example of an optical projection system 100, according to an embodiment of the present disclosure. The optical projection system 100 may be a time-of-flight camera (e.g., for depth sensing), a structured light scanner (e.g., for three-dimensional shape sensing), a dot projection camera (e.g., for three-dimensional shape sensing), a stereo camera system (e.g., for three-dimensional imaging), or other systems that project light and rely on the projected light to support a user-related application (e.g., depth sensing, shape sensing, laser scanning, augmented reality, etc.).

As illustrated, the optical projection system 100 may include a camera 120, a controller 130, a set of light source packages 140, and a set of sensor systems 150, among other components installed on a substrate 110 (e.g., a power supply, a processor, and a memory not shown in FIG. 1). Light is emitted from one or more of the light source packages 140 and image data is generated by the camera 120 to show an illuminated object (not shown in FIG. 1). The image data may be analyzed by the processor in support of the user-related application. For instance, within the context of depth sensing, the time-of-flight of the light is measured to determine the distance between the camera 120 and the illuminated object.

Each of the light source packages 140 may include a set of light sources, such as an array of laser diodes, and a set of optical elements, such as an optical diffuser or a diffractive optical element (DOE), among other components (e.g., a photodiode as further illustrated in the next figures). In turn, each or some of the optical elements in a light source package 140 may include an electrically conductive material that is transparent to the light signals transmitted from the set of light sources in the light source package 140. For example, the electrically conductive material may be an ITO layer, such as a coating or a film. The electrically conductive material on an optical element may be electrically coupled to the power supply and to one of the sensor systems 150.

A sensor system 150 may include sensing circuitry to measure a set of electrical parameters associated with an electrically conductive material, such as a current sense amplifier, an analog to digital converter (ADC), and a voltage comparator, among other components (e.g., a current-to-voltage converter such as a transimpedance amplifier (TIA), if a photodiode is used as further illustrated in the next figures). Examples of light source packages, electrical coupling, and sensor systems are further illustrated in the next figures.

The controller 130 may obtain measurements of an electrical parameter for an electrically conductive material in a light source package 140. For instance, the controller is electrically coupled to the electrically conductive material (e.g., an ITO layer). Based on the measurements, the controller 130 determines whether a damage to an associated optical element may exist. Generally, the damage may change an optical property of the optical element or of the arrangement of the optical element within the light source package 140 beyond a baseline optical property. The baseline may correspond to an eye safe condition and can be defined according to a design or a calibration of the optical element or the light source package. Thus, the damage can be of any type that may create an unsafe eye condition. For example, the damage can be a removal of the optical element from the light source package 140 or a change to optical element impacting the refraction, diffraction, spreading, patterning, and/or transmission of the light by the optical element. If damage exists (or likely exists), the controller 130 may initiate a corrective action. In an example, to avoid any risk of an unsafe eye condition, the corrective action includes turning off the set of light sources in the damaged light source package 140 or, alternatively, reducing the light intensity by controlling the power to the light source in this package 140. In addition, the corrective action may include generating a fault report identifying the damaged light source package 140, indicating that a damage likely exists, and/or identifying the type of the damage. Further, the controller may turn on a redundant set of light sources available from another undamaged light source package 140.

Figure 2:
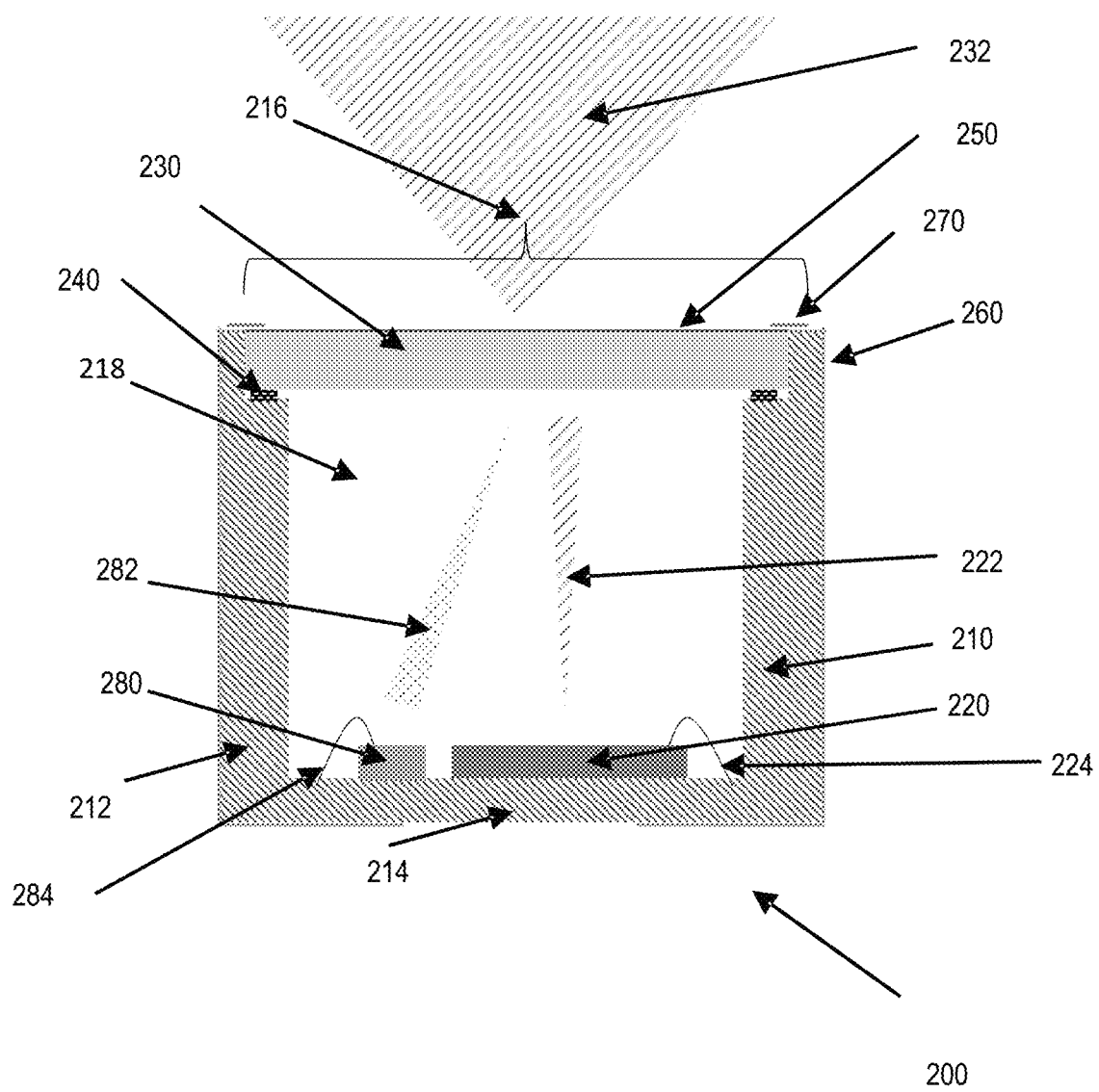
FIG. 2 illustrates a cross section view of an example of a light source package.

FIG. 2 illustrates a cross section view of an example of a light source package 200, according to an embodiment of the present disclosure. The light source package 200 may include a package body 210, a light source 220, and an optical element 230. Light 222 is emitted from the light source 220 towards the optical element 230. In turn, the optical element 230 spreads out the light 222 outwardly from the light source package 200 (shown as spread out light 232).

As illustrated, the package body 210 is a housing that includes a set of walls 212 connected to a base 214, and an opening opposite 216 to the base 214. The set of walls 212 and the base 214 are made out of an electrically and thermally non-conductive rigid material, such as a rigid plastic, and define an interior volume 218 of the package body 210. The interior volume 218 ends at the opening 216. The shape and dimensions of the package body 210 can be defined for a specific configuration to be used with an optical projection system. For instance, the set of walls 212 and the base 214 may form a cuboid, a cube, a cylinder, or any other shape. The width, height, and length (as applicable) the package body 210 can be in the range of 0.1 to 20.0 centimeters.

The light source 220 is contained inside the interior volume 218 of the package body 210. For instance, the light source 220 may be installed on the interior surface of the base 214 and may be electrically coupled to a substrate of the optical projection system via a set of wires 224. In the case of wire bonded light source, the electrical coupling includes the wire bond for either the cathode or anode on top of the die, as well as die bond paste on the bottom of the die to close the circuit with the other anode/cathode of the die. Other means for electrically coupling the light source 220 can be used including, for instance, flip-chip installation (e.g., a flip-chip VCSEL die instead of a wire bonded VCSEL die). In an example, the light source 220 may include an edge emitting laser die or a small divergence emitter die, such as a single VCESL die, a one dimensional array or two dimensional array of edge emitting lasers or VCSEL dies. The array may include a number of VCSEL emitters, such as around seven-hundred. In addition, a single die can be used, where this die may include array of apertures, such as a VCSEL die with multiple light emission points. The single die with multiple apertures can also be formed on edge emitting lasers.

The optical element 230 occupies at least a portion of the opening 216 of the package body 210 (shown in FIG. 2 as occupying the entire opening 216). This element 230 is optically transparent to the light 222 emitted from the light source 220 and spreads it out from the light source package 200. For instance, the optical element 230 is a diffuser that spreads out the light 222 uniformly or is a DOE that spreads out the light 222 in a pattern. Generally, the optical transmission of the optical element 230 depends on its configuration, such as the material (e.g. glass) and its thickness (e.g., between 0.1 mm to 5.0 mm). In an example of a diffuser, the optical transmission is in the range of 70.0 to 99.9%.

Further, the optical element 230 may be attached to the package body 210 via mechanical retention 240. For example, glue or epoxy may be used to secure ends of the optical element 230 against the wall(s) 212 or a notch(es) in the wall(s) 212 of the package body 210. Generally, the surface of the optical element 230 facing the interior volume 218 of the package body 210 is referred to herein as an internal surface of the optical element 230. The surface of the optical element 230 opposite to its internal surface is referred to herein as an external surface of the optical element 230. Each of the internal surface and external surface may be a surface transparent to the light 222 or may include at least a portion that is transparent to the light 222. As illustrated in FIG. 2, the internal surface of the optical element 230 faces the light source 220 and receives the emitted light 222, whereas the light 232 is spread out from the external surface of the optical element 230. Accordingly, the optical element 230 (e.g., a diffuser) includes an internal surface facing the laser diode and an opposing external surface.

In an example, the light source package 200 further includes an electrically conductive material 250 disposed over the external surface of the optical element 230. For instance, the electrically conductive material 250 is placed on and extends across the entire optical element 230, or across a portion of the optical material. This portion corresponds to uncovered and unobstructed area from which light can be spread out. The electrically conductive material 250 may be attached to as a film, or deposited as a coating on the external surface (and/or the internal surface). Generally, the electrically conductive material 250 is also transparent to the light 222 emitted from the light source 220. For instance, the electrically conductive material 250 is an ITO layer (e.g., film or coating), or a conductive grid with apertures sized based on the wavelength of the light 222 or based on aperture sizes of the light source 220. The thickness and distribution of the electrically conductive material 250 can be defined to achieve electrical conductivity and optical transmission targeted for a specific configuration to be used with the optical projection system. For instance, in the case of a uniform ITO coating, the thickness is in the range of 1 nm to 500 nm, the electrical conductivity is in the range of 1Ω to 1000Ω, and the optical transmission is in the range of 70 percent to 99%. It should be appreciated that the optical transmissions of the optical element 230 and the electrically conductive material 250 are cumulative, resulting in a total optical transmission of the light source package 200. For instance, for a diffuser, the total optical transmission can be in the range of 70 to 99% depending on the configurations of the optical element 230, the electrically conductive material 250, and the desired performance.

To support the capability of measuring the electrical conductivity (or another electrical parameter) of the electrically conductive material 250 and enable detection of damage to the optical element 230, the light source package 200 also includes an electrically conductive path for this electrically conductive material 250. In particular, when the light source package 200 is mounted on the substrate of the light projection system, the conductive path electrically couples the electrically conductive material 250 to the substrate, thereby providing a path for a sensor system to measure one or more electrical parameters of the electrically conductive material 250. Generally, the conductive path can include plated routing, wire bonding, conductive attachment, bonding paste, reflow processes, or any combination thereof.

In an example, the electrically conductive path includes a first portion 260 along the package body 210 and a second portion 270 (also referred to herein as a conductive coupling portion) that electrically connects the first portion to the electrically conductive material 250. As illustrated, the first portion 260 may be terminal plating on the external surface of the package body 210 (e.g., the surface opposite to the interior volume 218), along the set of walls 212 and at least a section of the base 214. The terminal plating may end at a set of connection points on the external surface of the base 214, where these connection points may be soldered to the substrate as further illustrated in the next figures. The second portion 270 may include an electrically conductive tape, an electrically conductive die bond paste, an electrically conductive epoxy, or a solder that electrically couples the electrically conductive material 250 to first portion 260 (e.g., the terminal plating). Wiring may also or alternatively be used in the first portion 260 and/or second portion 270.

Generally, changes to an electrical parameter of the electrically conductive material 250 may indicate a damage to the optical element 230, where the damage may change an optical property of the optical element 230, and where the change may cause a risk for an unsafe eye condition. Examples of the damage include removal of the optical element 230 from the opening 216 of the package body 210, thereby preventing the spreading out of the emitted light 222. Examples of the damage also include a crack in the optical element 230 or a scratch to its external surface, where such a damage may also prevent the targeted spreading out of the emitted light 222.

In an example, the light source package 200 may also include a photodiode die 280 that can be used to monitor and sense reflected light 282 from the optical element 230 as a second means to detect or confirm the damage. Wiring 284 may couple the photodiode 280 to the substrate of the light projection system. The photodiode die 280 converts the reflected light 282 into an electrical current that, in turn, can be measured by a sensor system. In addition, the photodiode 280 is usable to detect thermal drift of the light source's 220 optical output, thereby allowing adjustment to this output. Although FIG. 2 illustrates wiring 284 to couple the photodiode 280, other coupling means are possible. For instance, the photodiode 280 can be flip-chip with a die bond paste assembly, or a packaged photodiode that is attached by a reflow process.

Figure 3:
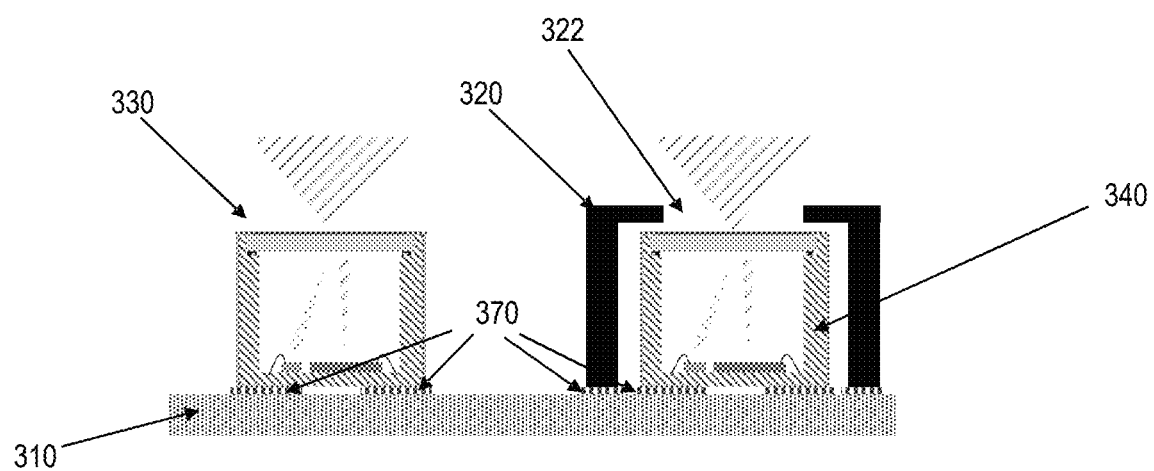
FIG. 3 illustrates a cross section view of examples of mounting light source packages on a substrate of a light projection system.

FIG. 3 illustrates a cross section view of examples of mounting light source packages on a substrate 310 of a light projection system, according to an embodiment of the present disclosure. Two examples are provided: one without an interlock (shown on the left side of the figure) and one with an interlock 320 (shown on the right side of the figure). The substrate 310 may be a PCB, a rigid flex printed circuit (RFPC), a flex printed circuit (FPC), or any type of substrate available for mounting the light source packages and any interlock.

As illustrated on the left side of FIG. 3, a light source package 330 (similar to the light source package 220 of FIG. 2) is soldered to the substrate 310. In particular, connection points along the terminal plating on the external surface of the package body of the light source 330 are soldered to the substrate 310, where the soldering forms solder joint 370. Although not shown in FIG. 3, similar solder joints are formed for the anodes and cathodes of the small divergence emitter die and the photodiode die disposed inside the light source package 330.

As illustrated on the right side of FIG. 3, a light source package 340 is similarly soldered to the substrate 310. In addition, the interlock 320 is mounted to the substrate 310 (e.g., directly soldered thereto), includes (fully or partially) the light source package 340, and includes a window opening 322 that is parallel to the opening of the package body of the light source package 340. Generally, the interlock 320 may provide a rigid structure made out, for instance, metal that further protects the light source package 340 and prevents unsafe eye conditions. When the interlock 320 is removed, the electrical connection between the light source package 340 and the substrate 310 may be broken and a controller of the light projection system may disable the light source inside the light source package 340. As such, the interlock 320 can be used to detect accidental mechanical damage or intentional tampering. The interlock 320 may also add some protection during handling and as a tamper detection device. Generally, the interlock 320 may have a similar shape (e.g., cuboid) of the light source package 340 and may be dimensioned to be slightly larger than this package 340 such that the interlock 320 encompasses the entire light source package 340.

The window opening 322 of the interlock 320 may allow transmission of the light emitted from the light source package 340. The window opening 322 can either be left as an empty opening or can contain an optically transparent material, such as glass. If left open, then in case a small tool passes through the window opening 322 and damages the optical element of the light source package 340, the electrical conductive material on this optical element can be used to detect the damage.

The interlock 320 and its design and installation to encompass the light source package 340 would prevent the optical element from falling or moving away from its intended physical location in case this element is removed from the light source package 340. This may improve eye safety by allowing the optical element to nonetheless attenuate the emitted light, whereas the electrical conductive material of the light source package 340 may allow the detection that the optical element has become detached.

In addition, when terminal plating of the light source package 340 is on the external surface of the package body, the interlock 320 may prevent contact of foreign objects with this terminal plating. Accordingly, electrical shorts, electrical opens, or damages to the terminal plating may be prevented.

Although FIG. 3 illustrates a single light source package in an interlock, the interlock 320 may encompass multiple light source packages. In this case, the interlock may have a similar structure as the interlock 320, include multiple window openings each corresponding to one of the light source packages, and may be shaped and dimensioned to contain the various light source packages.

Figure 4:
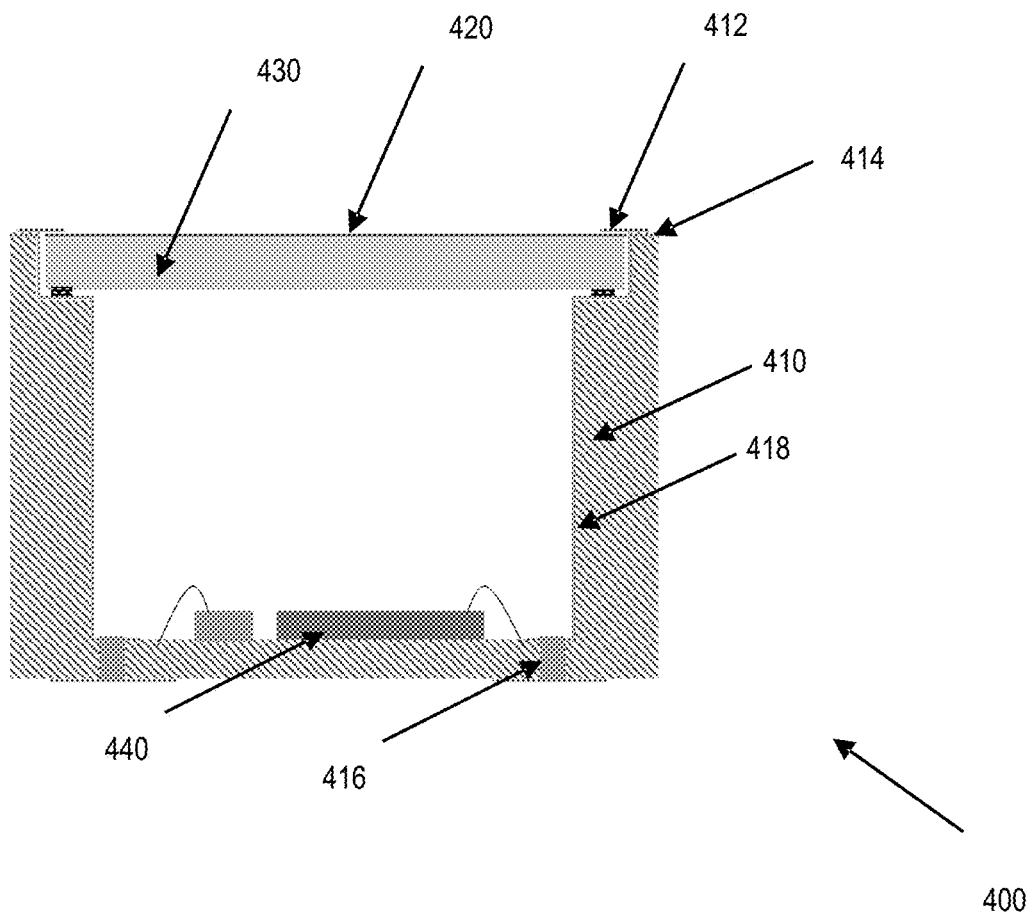
FIG. 4 illustrates a cross section view of an example of a conductive path in a light source package.

FIG. 4 illustrates a cross section view of an example of a conductive path 410 in a light source package 400, according to an embodiment of the present disclosure. The light source package 400 may have similar components as the light source package 200 of FIG. 2. However, its conductive path 410 is at least partially internal to the light source package 400 rather than being external as illustrated in connection with FIG. 2. The conductive path 410 is electrically coupled with an electrically conductive material 420 disposed over an external surface of an optical element 430 of the light source package 400.

In particular, the conductive path 410 may include a number of electrically conductive portions such as a conductive coupling portion 412, a top plating portion 414, a bottom plating portion 416, and an internal plating portion 418. The conductive coupling portion 412, top plating portion 414, and bottom plating portion 416 are on external surfaces of the package body (e.g., on the outside of the light source package 400). The internal plating portion 418 is on an internal surface of the package body (e.g., is inside the interior volume). The conductive coupling portion 412 electrically couples the electrically conductive material 420 with the top plating portion 414 and includes, for example, an electrically conductive tape, an electrically conductive die bond paste, an electrically conductive epoxy, or an electrically conductive solder. The top plating portion 414 includes terminal plating on the outside of a top surface of a wall of the package body and is connected to the internal plating portion 418. In turn, the internal plating portion 418 includes terminal plating on the wall's inside surface between the top surface and the base, where the internal plating portion 418 meets the bottom plating portion 416. As illustrated, the base may include a number of openings. The bottom plating portion 416 includes terminal plating that occupies the openings and extends on the base's external surface. The bottom plating portion 416 represents a package via which connects the internal electrical portion 418 to surface mount pads on the external surface of the package body. Accordingly, the top plating portion 414 and the internal plating portion 418 form conductive coatings, whereas the bottom plating portion 416 forms conductive pads usable as solder joints when the light source package 400 is mounted on a substrate.

Hence, upon installation on a substrate that includes, for instance, a sensor system and a controller, damage associated with the light source package 400 can be monitored. In particular, the conductive path 410 would electrically couple the electrically conductive material 420 to the sensor system. This sensor system would measure and provide an electrical parameter of the electrically conductive material 420 to the controller. Upon detecting a particular change to the electrical parameter indicating a potential for an unsafe eye condition, the controller may initiate a corrective action (e.g., turn off) associated with a light source 440 of the light source package 400.

Figure 5:
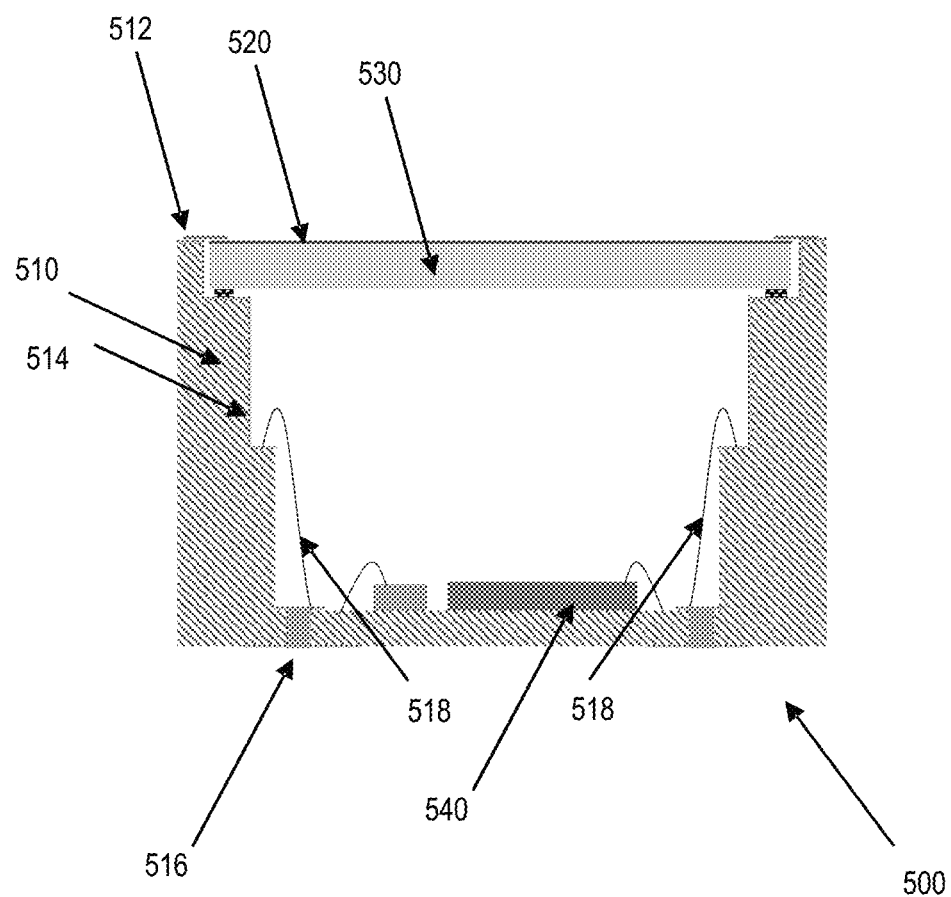
FIG. 5 illustrates a cross section view of another example of a conductive path in a light source package.

FIG. 5 illustrates a cross section view of another example of a conductive path 510 in a light source package 500, according to an embodiment of the present disclosure. The light source package 500 may have similar components as the light source package 400 of FIG. 4. However, its conductive path 510 includes internal wiring in addition to terminal plating. Here also, the conductive path 510 is electrically connected to an electrically conductive material 520 disposed over an external surface of an optical element 530 of the light source package 500.

As illustrated, the internal surface of the wall of the package body follows a step structure. The terminal plating is on some, but not all, of the steps. The internal wiring connects portions of the terminal plating that would otherwise not be electrically coupled. Although a step structure is illustrated in FIG. 5, internal wiring can be similarly used with other structures or configurations of the package body. In particular, the internal wiring can be used to electrically couple two areas of the package body that could not be easily plated or where the plating may have reliability concerns.

In particular, the conductive path 510 includes a conductive coupling portion 512, top plating and internal plating portions 514 and a bottom plating portion 516. A terminal plating gap exists between the top plating and internal plating portions 514 and the bottom plating portion 516. Accordingly, the conductive path 510 further includes an internal wire 518 that electrically couples the top plating and internal plating portions 514 to the bottom plating portion 516.

Hence, upon installation on a substrate that includes, for instance, a sensor system and a controller, damage associated with the light source package 500 can be monitored. In particular, the conductive path 510 would electrically couple the electrically conductive material 520 of the light source package 500 to the sensor system. This sensor system would measure and provide an electrical parameter of the electrically conductive material 520 to the controller. Upon detecting a particular change to the electrical parameter indicating a potential for an unsafe eye condition, the controller may initiate a corrective action (e.g., turn off) associated with a light source 540 of the light source package 500.

Figure 6:
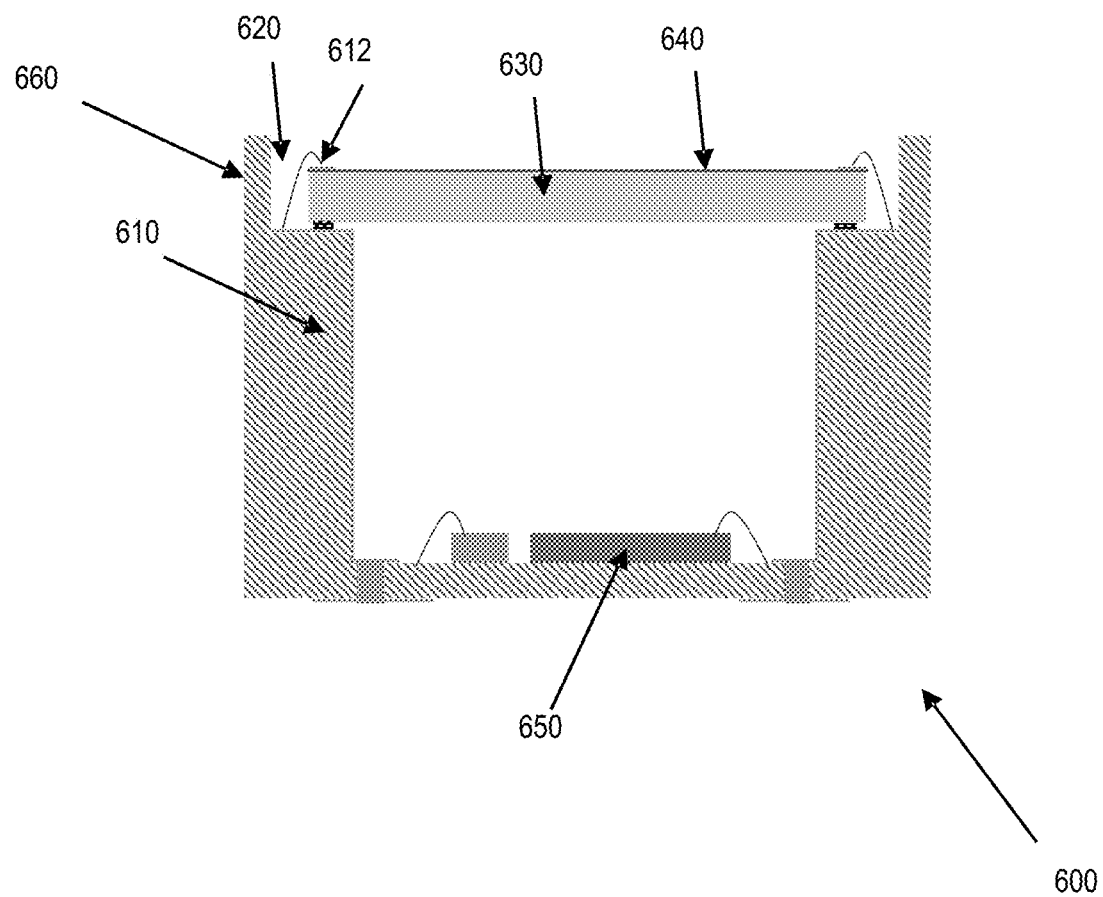
FIG. 6 illustrates a cross section view of yet another example of a conductive path in a light source package.

FIG. 6 illustrates a cross section view of yet another example of a conductive path 610 in a light source package 600, according to an embodiment of the present disclosure. The light source package 600 may have similar components as the light source package 400 of FIG. 4. However, its conductive path 610 includes wiring instead of a conductive coupling portion. Here also, the conductive path 610 is electrically connected to an electrically conductive material 640 disposed over an external surface of an optical element 630 of the light source package 600.

As illustrated, a gap 620 exists between the optical element 630 and a wall 660 of the of the light source package 600. The conductive path 610 includes a wire 612 that electrically couples, via wire bonding, the electrically conductive material 640 on the optical element 630 with internal terminal plating of the light source package 600. This wire 612 is routed in the gap 620.

Hence, upon installation on a substrate that includes, for instance, a sensor system and a controller, damage associated with the light source package 600 can be monitored. In particular, the conductive path 610 would electrically couple the electrically conductive material 640 to the sensor system. This sensor system would measure and provide an electrical parameter of the electrically conductive material 640 to the controller. Upon detecting a particular change to the electrical parameter indicating a potential for an unsafe eye condition, the controller may initiate a corrective action (e.g., turn off) associated with a light source 650 of the light source package 600.

Figure 7:
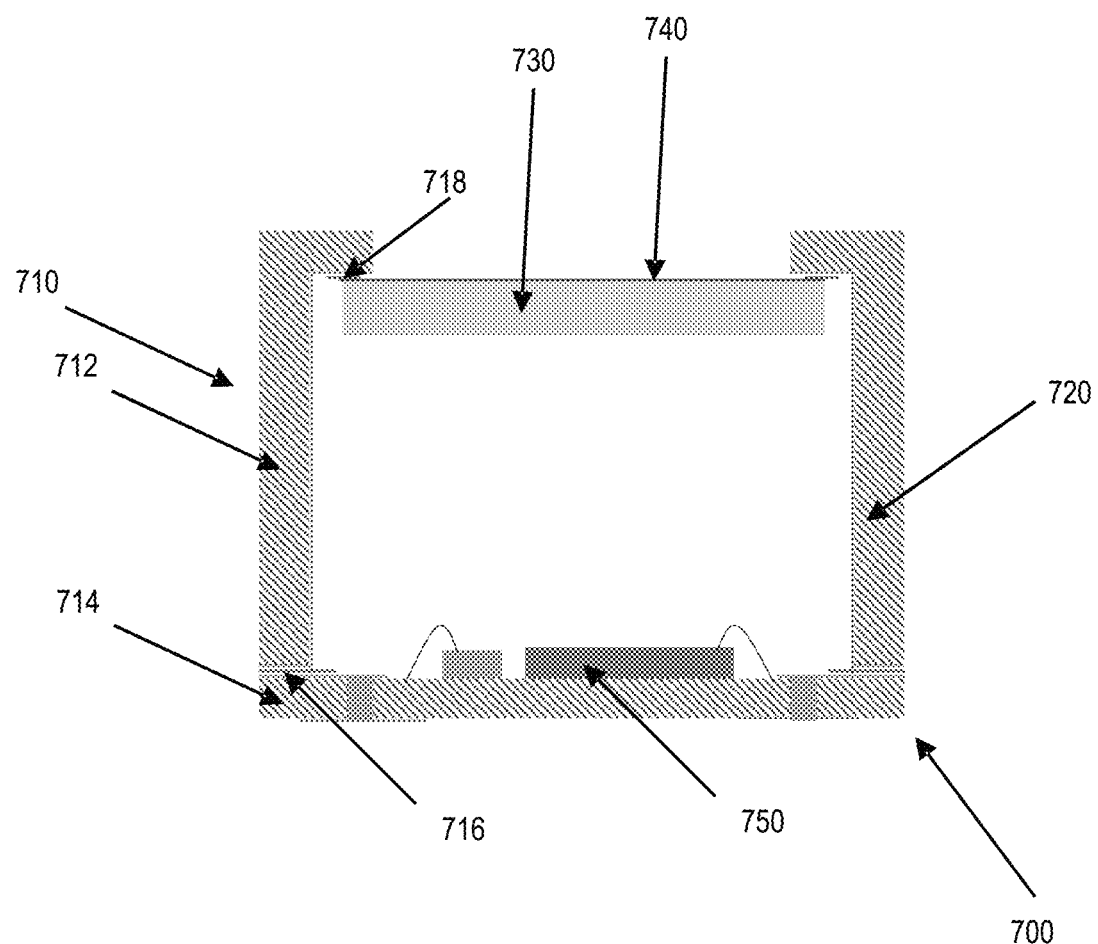
FIG. 7 illustrates a cross section view of a further example of a package body in a light source package.

FIG. 7 illustrates a cross section view of a further example of a package body 710 in a light source package 700, according to an embodiment of the present disclosure. The light source package 700 may have similar components as the light source package 200 of FIG. 2. However, the design of the package body 710 may be different and the light source package 700 may include an internal conductive path 720. Here also, the conductive path 720 is electrically connected to an electrical conductive material 740 disposed over an optical element 730 of the light source package 700.

As illustrated, the package body 710 includes a wall 712 and a base 714. These two portions of the package body 710 are not integrally formed, but may be two structures joined via a conductive coupling portion 716 (e.g., electrically conductive tape, an electrically conductive die bond paste, an electrically conductive epoxy, or a solder). This conductive coupling portion 716 may secure and couple terminal plating on the joined surfaces of the wall 712 and the base 714. Further, the wall 712 has an L-shape. The electrically conductive material 740 on the optical element 730 of the light source package 700 is securely connected and electrically coupled to terminal plating on the inside surface of the short portion of the L-shape via a conductive coupling portion 718. Accordingly, the conductive path 720 includes the two conductive coupling portions 716 and 718 in addition to terminal plating on internal surfaces of the wall and terminal plating on an internal surface, openings, and an external surface of the base 714.

Hence, upon installation on a substrate that includes, for instance, a sensor system and a controller, damage associated with the light source package 700 can be monitored. In particular, the conductive path 720 would electrically couple the electrically conductive material 740 to the sensor system. This sensor system would measure and provide an electrical parameter of the electrically conductive material 740 to the controller. Upon detecting a particular change to the electrical parameter indicating a potential for an unsafe eye condition, the controller may initiate a corrective action (e.g., turn off) associated with a light source 750 of the light source package 700.

Although the figures of the present disclosure, including FIGS. 2-7, illustrate an electrically conductive material disposed over an external surface of an optical element, embodiments of the present disclosure are not limited as such. Additionally or alternatively, the electrically conductive material can be disposed over an internal surface of the optical element. This internal disposition also allows the detection of damage to the optical element including, for instance, the removal of the optical element from a light source package, a crack in the optical element, a scratch to the internal surface of the optical element (e.g., due to manufacturing defect or improper handling during installation), a delamination of a polymer material on the internal surface (such as a refractive or diffractive polymer, where the delamination may change an optical property of the optical element), among other types of damage. Further, the internal disposition may render the light source package smaller because the internal wiring to electrically couple the electrically conductive material can be reduced and may simplify the assembly of the light source package.

Figure 8:
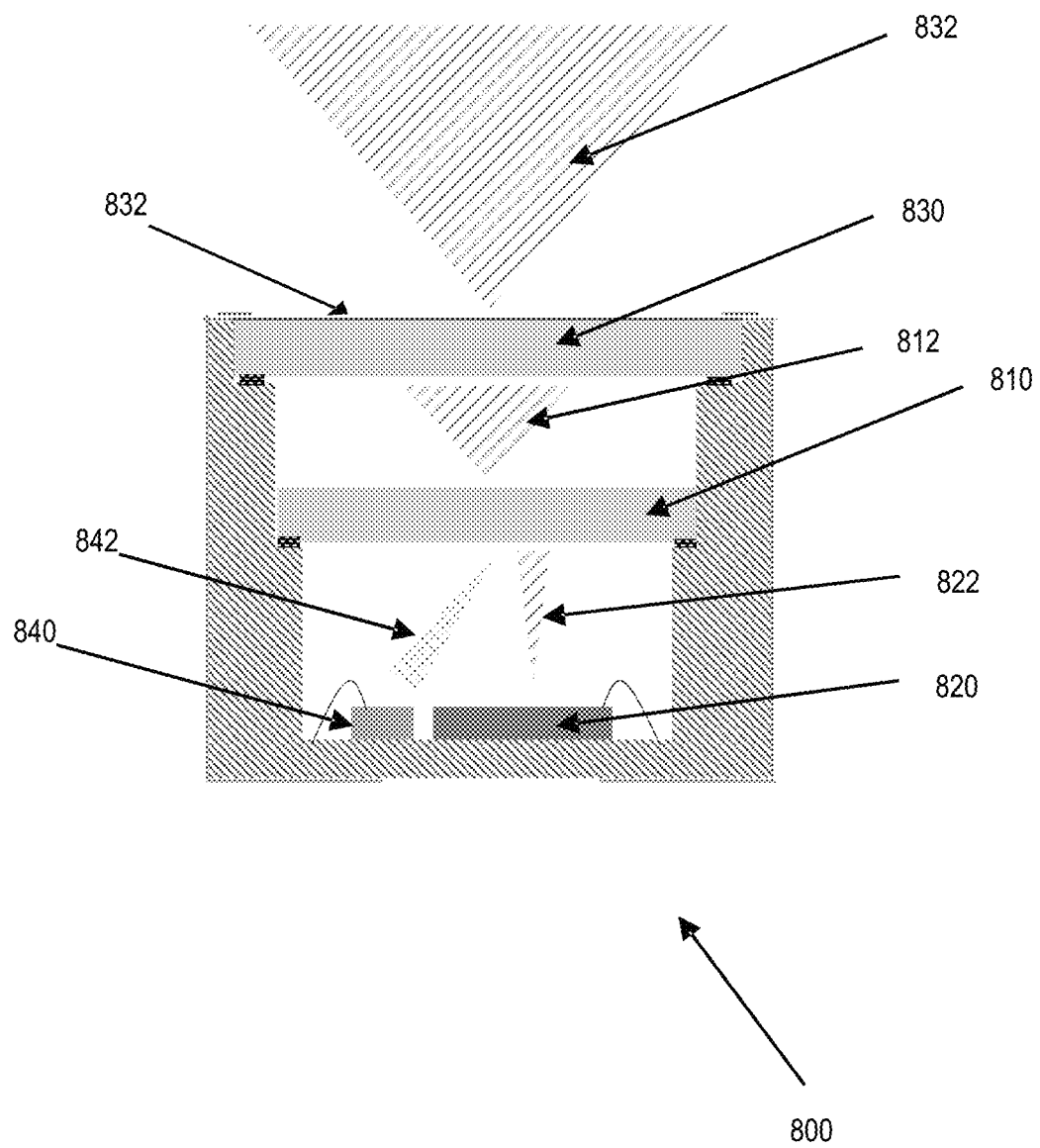
FIG. 8 illustrates a cross section view of another example of a light source package.

FIG. 8 illustrates a cross section view of another example of a light source package 800, according to an embodiment of the present disclosure. The light source package 800 may have similar components as the light source package 200 of FIG. 2. In addition, the light source package 800 includes a second optical element, referred to herein as an internal optical element 810.

In an example, the internal optical element 810 is placed in the interior volume of the package body of the light source package 800. For instance, the internal optical element 810 is disposed between a light source 820 and the first optical element 830 of the light source package 800. As illustrated, the first optical element 830 occupies at least a portion of the opening of the package body and is referred to herein as an external optical element. Accordingly, light 822 emitted from the light source 820 reaches the internal optical element 810 first. In turn, the internal optical element 810 passes light 812 to the external optical element 830 that spreads out as light 832. In an illustrative use case, the internal optical element is a collimating lens that collimates the incident light 812.

In this example, no electrically conductive material may exist on the internal optical element 810 and this element 810 may not be electrically coupled to other components of the light source package 800. In comparison, the external optical element 830 includes an electrically conductive material 832 that is electrically coupled (with an external conductive path as in FIG. 2 or an internal conductive path as in any of FIGS. 4-7) and that is usable to detect damage to at least the external optical element 830.

Optionally, the light source package includes a photodiode 840 usable to detect damage to the internal optical element 810. In particular, this photodiode 840 can be used to monitor and sense reflected light 842 from the internal optical element 810. The resulting electrical current can indicate multiple types of potential damage to the internal optical element 810. For instance, misalignment of the internal optical element 810 relative to the light source 820 is detected given the change to the amount of the reflected light 842. Further, removal of the optical element 810 can be similarly detected. Other types of damage can be similarly detected including, for instance, a change to the optical element 810 impacting the refraction, diffraction, spreading, patterning, and/or transmission of the light by the optical element 810. In addition, the photodiode 840 is usable to detect thermal drift of the light source's 820 optical output, thereby allowing adjustment to this output.

In an example, the detection of the damage to the internal optical element 810 can be used as a trigger to detect damage to the external optical element 830 based on the electrically conductive material and/or the photodiode 840. The results of both damage detections can be jointly used to identify the type(s) of damages for optional fault reporting. For instance, if no reflected light is received by the photodiode 840 and no electrical current is flowing through the conductive material, a determination can be made that both optical elements 810 and 830 have been removed. If damage is detected to the internal optical element 810, but not to the external optical element 830, a determination can be made that the damage is caused by vibration, temperature stress or some factor other than a mechanically induced damage through the external optical element 830.

Figure 9:
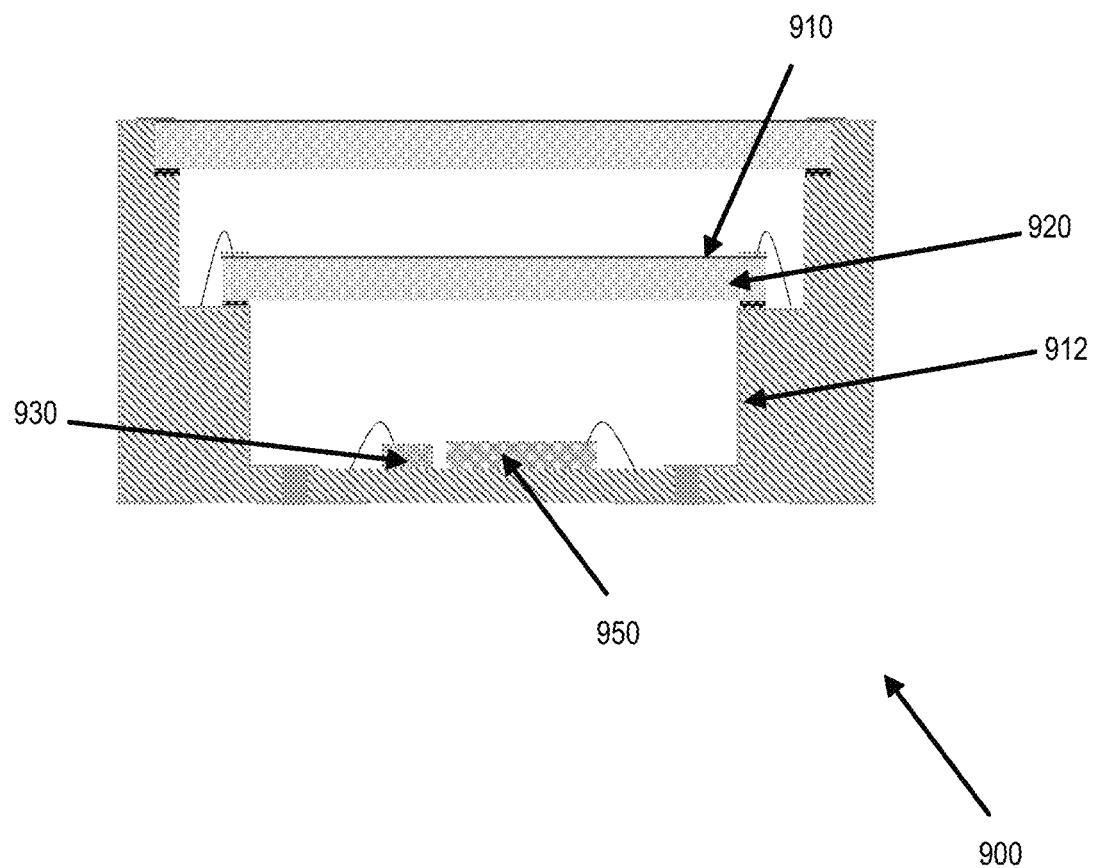
FIG. 9 illustrates a cross section view of yet another example of a light source package.

FIG. 9 illustrates a cross section view of yet another example of a light source package 900, according to an embodiment of the present disclosure. The light source package 900 may have similar components as the light source package 800 of FIG. 8 (including a light source 950). In addition, the light source package 900 includes an electrically conductive material 910 on the internal optical element 920.

As illustrated, the electrically conductive material 910 can be electrically coupled by using an internal conductive path 912 similarly to any of the conductive paths described in connection with FIGS. 4-7. In comparison, the electrically conductive material on the external optical element can be electrically coupled by using an external conductive path (as shown in FIG. 9 and similarly to the external conductive path of FIG. 2) or any of the internal conductive paths described in connection with FIGS. 4-7.

In an example, the electrically conductive material 910 is used to detect damage to the internal optical element 920. For instance, an electrical parameter (e.g., resistance, voltage, current) of this electrical material 910 is monitored to detect a removal of, a crack in, a scratch, or other change to the internal optical element 920 impacting its optical properties.

Optionally, light source package 900 also includes a photodiode 930. In this case, the photodiode 930 is usable to as a redundant source for detecting and/or confirming damage to the internal optical element 920.

Although FIGS. 8 and 9 illustrate the use of two optical elements, a light source package may include a larger number of optical elements (e.g., one external optical element with multiple internal optical elements). When multiple optical elements are used, such as the illustrative embodiments of FIGS. 8 and 9, an electrically conductive material may be disposed over an internal surface or an external surface of an optical elements. If multiple electrically conductive materials are used, their dispositions need not be the same and can vary between being on an internal surface and an external surface. For instance, in a light source package that includes an external optical element and an internal optical element, a first electrically conductive material may be disposed over an external surface of the external optical element and a second electrically conductive material may be disposed over an internal surface of the internal optical element.

Figure 10:
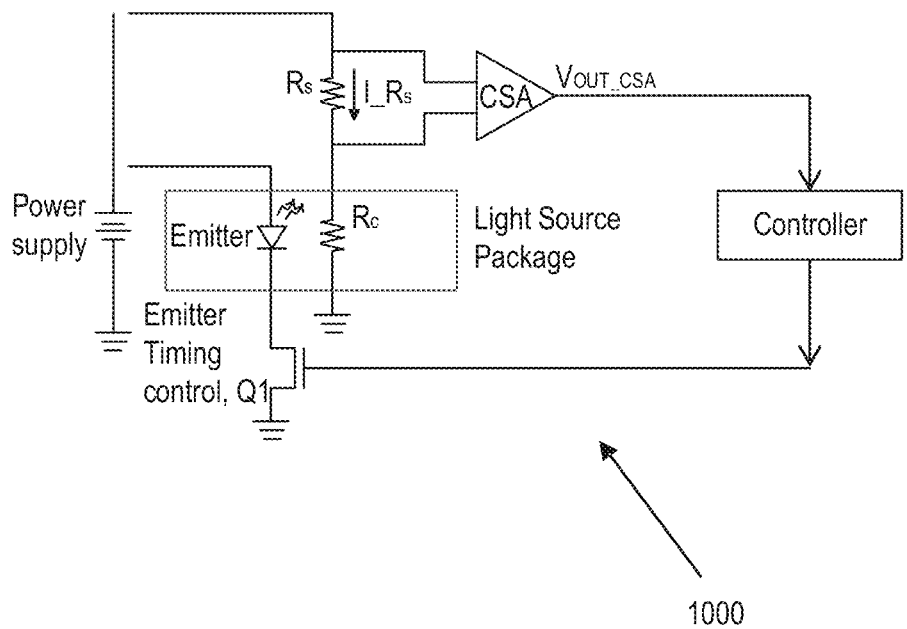
FIG. 10 illustrates an example of a diagram of a circuit for detecting damage to an optical element of a light source package and for controlling a light source of the light source package.
Figure 14:
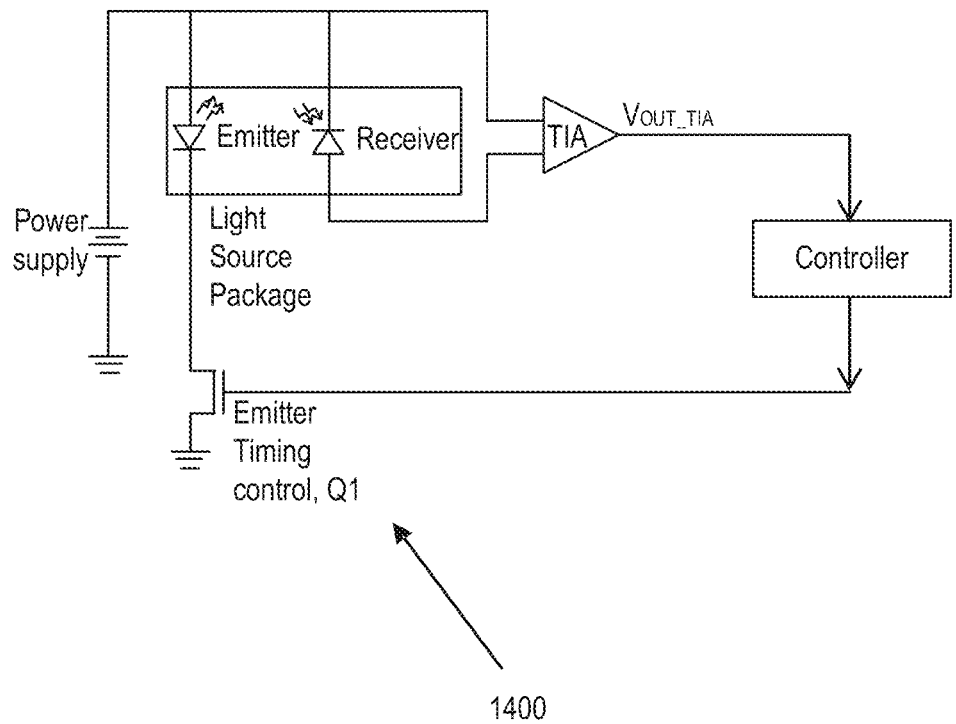
FIG. 14 illustrates an example of a diagram of a circuit for detecting damage to an optical element of a light source package based on a photodiode of the light source package.

FIG. 10 illustrates an example of a diagram of a circuit 1000 for detecting damage to an optical element of a light source package and for controlling a light source of the light source package, according to an embodiment of the present disclosure. In this example, the light source package may be similar to the light source package 200 of FIG. 2. Sensing circuitry related to a photodiode is not shown in FIG. 10 (but is shown in FIG. 14). This circuit 1000 is used to determine a change to the electrical conductivity of an electrically conductive material on the optical element. In particular, the circuit 1000 allows monitoring the change of electrical current through a resistance, which is converted to a voltage, based on a change in the physical path (e.g., electrical resistance) of the electrically conductive material. However, other circuit configurations are possible to monitor other electrical parameters associated with the electrically conductive material, such as by monitoring a current.

As illustrated, the circuit 1000 includes a light emitter (representing the light source) and a resistor $R_c$ (representing the electrically conductive material on the optical element). In addition, the circuit 1000 includes a resistor $R_s$ and a current sense amplifier that represent a sensor system. The circuit 1000 also includes a controller (e.g., a microprocessor) hosting logic for detecting the damage and controlling the light emitter. The control can include turning on and off power to the light emitter via a field-effect transistor (FET), shown as an emitter timing control, Q1 the circuit 1000. The FET is used for modulation control of the light emitter and for disabling the light emitter upon detection of damage to the optical element. As also illustrated, the circuit 1000 includes a power supply. Although an emitter timing control, Q1 is illustrated, the circuit 1000 optionally includes this component. In particular, the controller can directly disable the power supply, if the power supply is dedicated for the light emitter.

In an example, the light emitter is connected to the power supply and the field-effect transistor. In parallel to this portion of the circuit 1000, the resistors $R_S$ and $R_c$ are connected in series, with the power supply on the side of the resistor $R_s$. Although the same power supply is connected to both the light emitter and the resistor $R_c$, these electrical components of the light source package can be connected to two different power supplies.

The current sense amplifier is connected across the resistor $R_s$, senses the electrical current $I\_R_s$ passing through this resistor $R_s$, and converts this electrical current $I\_R_s$ to a voltage $V_{OUT\_CSA}$. This analog voltage $V_{OUT\_CSA}$ or a digitally converted voltage (through an analog-to-digital converter (ADC) not shown in FIG. 10) is fed to the controller. Based on a value of the sensed voltage and a damage profile accessible to the controller, the controller determines whether damage to the optical element has occurred (and optionally the type of damage) and enables or disables the light emitter's emitter timing control, Q1 and, accordingly, turns on or off power to the light emitter.

In an example, damage to the optical element corresponding to a physical damage to the electrical conductive material can be detected. In particular, the physical damage to the electrical conductive material changes the resistance of the resistor $R_c$ and, as a result, changes the electrical current $I\_R_s$ based on a fixed voltage from the power supply. The change to the electrical current $I\_R_s$ translates into a change to the voltage $V_{OUT\_CSA}$. Accordingly, the controller can monitor changes to the sensed voltage and compare these changes to change thresholds that are defined by the profile to detect the damage. For instance, if the sensed voltage is suddenly no longer detected (e.g., $V_{OUT\_CSA}$ is equal to zero), the controller can detect that the resistance of the resistor $R_c$ changed to a very high impedance and, thus, the optical element was removed. Similarly, if the sensed voltage changes to a value outside an operational voltage range (other than zero), the controller can detect that the resistance of the resistor $R_c$ (e.g., increased or decreased) and, thus, the optical element was scratched or cracked, but not removed. The profile can define these change thresholds (e.g., the zero voltage, upper and lower bounds on the operational voltage range(s)).

In an example, the profile can include additional intelligence about the type, location, and size of a damage for an operational condition (e.g., operational temperature, power level, etc.) given the sensed voltage or the change thereto and the corrective action that the controller should initiate. For example, for a given configuration of a light source package, lab testing may be conducted to measure the voltage responses (or the changes to the resistance of the resistor $R_c$) for the different types, locations, and sizes of damages to the electrically conductive material under different operational conditions and to estimate the impacts of the damages to the eye safety. Change thresholds can be derived from the voltage responses and mapped to levels of eye safety given the impacts. Different corrective actions can be defined for the eye safe level. For an eye unsafe level, the corrective action can include turning off power to the light source and preventing further use. For an eye safe level (but yet, there is some damage to the optical element), the corrective action can include allowing further use of the light source and increasing the rate of monitoring the voltage changes. Such intelligence about the damages and the corrective actions can stored in the profile and that profile can be downloaded to the controller. Hence, the profile can associate a change threshold with a type, a location, and a size of a damage based on an operational condition and can identify the corrective action that should be performed for that damage.

For instance, the profile can be stored as table accessible to the controller. The table associates a an operational voltage range with a potential type of damage and a corrective action. The controller can use the value of the sensed voltage to look up the table, match the value to one of the operational voltage ranges, and determine the applicable corrective action. An illustrative table is provided herein next. Other voltage ranges and mapping to potential damages and/or corrective actions are possible.

| Operational Voltage Range | Potential Damage | Corrective Action |
| --- | --- | --- |
| Smaller than 0.03 V | Removal of optical element | Turn off light source |
| Larger than 0.03 V and smaller than 0.3 V | Significant damage to optical element other than removal | Turn off light source |
| Larger than 0.3 V and smaller than 1.7 V | Moderate damage to optical element | Decrease power supplied to light source by half, double monitoring rate |
| Larger than 1.7 V and smaller than 3.3 V | Minor damage to optical element | Double monitoring rate |
| Larger than 3.3 V | No damage | No action |

Figure 11:
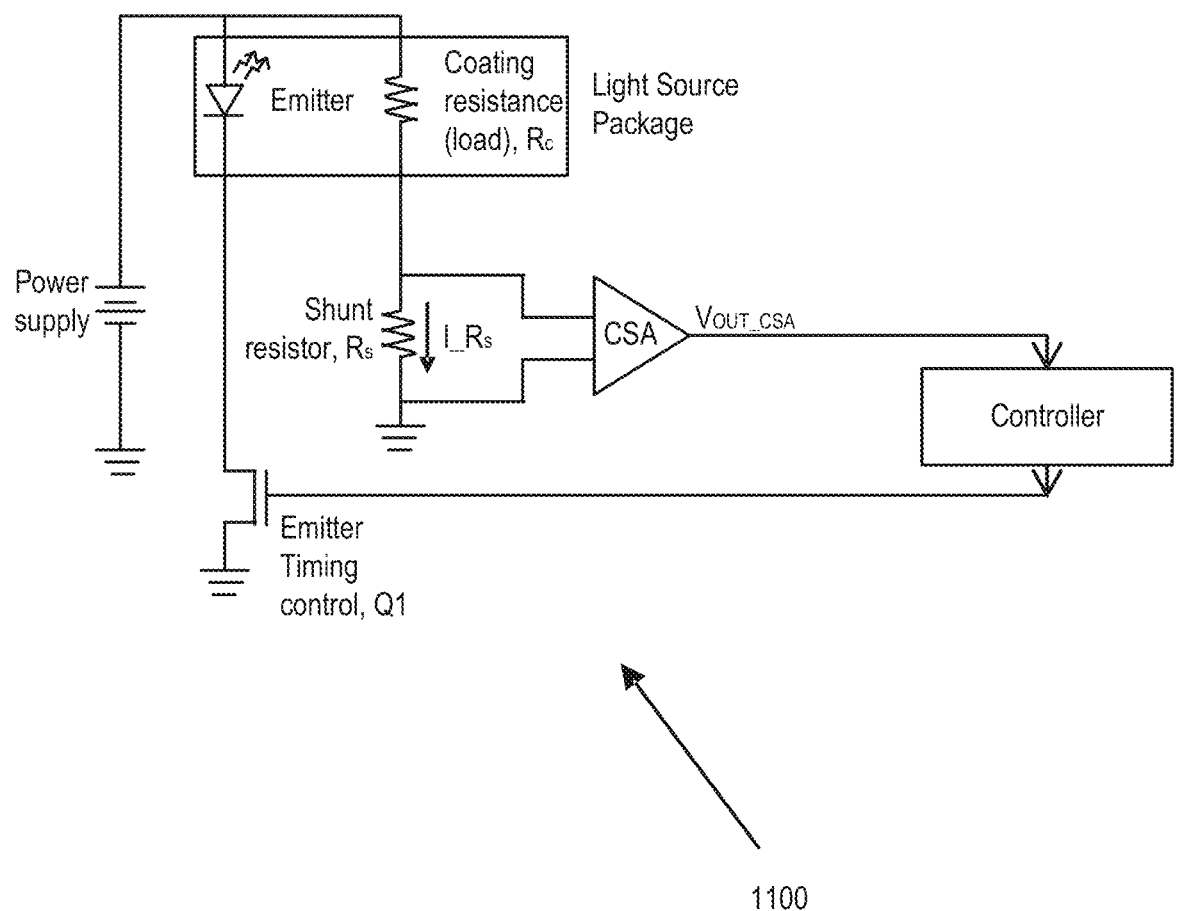
FIG. 11 illustrates an example of a diagram of another circuit for detecting damage to an optical element of a light source package and for controlling a light source of the light source package.

FIG. 11 illustrates an example of a diagram of another circuit 1100 for detecting damage to an optical element of a light source package and for controlling a light source of the light source package, according to an embodiment of the present disclosure. This circuit 1100 is similar to the circuit 1000 of FIG. 10, except that the power supply is connected to the resistor $R_c$ rather than the shunt resistor $R_s$.

In an example, damage to the optical element corresponding to a physical damage to the electrical conductive material can be detected. In particular, the physical damage to the electrical conductive material changes the resistance of the resistor $R_c$ and, as a result, changes the electrical current $I\_R_s$ flowing through the shunt resistor $R_s$ based on a fixed voltage from the power supply. The change to the electrical current $I\_R_s$ translates into a change to the voltage $V_{OUT\_CSA}$. Accordingly, the controller can monitor changes to the sensed voltage, compare these changes to change thresholds that are defined by a profile to detect the damage, and detect the damage based on the comparison. Upon detection of the damage, the controller can initiate a corrective action (e.g., turning off power to the light source).

Figure 12:
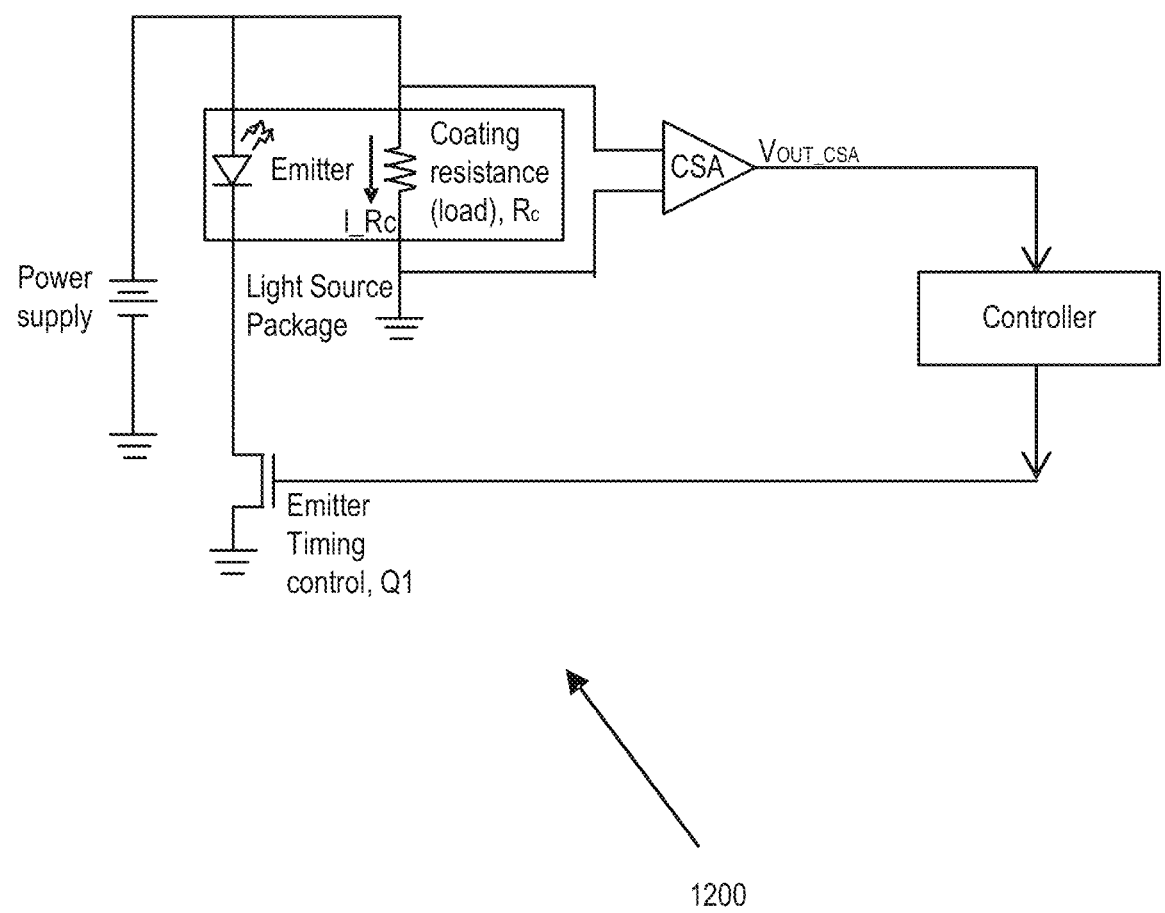
FIG. 12 illustrates an example of a diagram of yet another circuit for detecting damage to an optical element of a light source package and for controlling a light source of the light source package.

FIG. 12 illustrates an example of a diagram of yet another circuit 1200 for detecting damage to an optical element of a light source package and for controlling a light source of the light source package, according to an embodiment of the present disclosure. This circuit 1200 is similar to the circuit 1000 of FIG. 10, except that no shunt resistor $R_s$ is used. Instead, the current sense amplifier is connected across the electrically conductive material (e.g., represented as the resistor $R_c$), thereby directly monitoring the electrical current $I\_R_c$ passing through the electrically conductive material.

In an example, damage to the optical element corresponding to a physical damage to the electrical conductive material can be detected. In particular, the physical damage to the electrical conductive material changes the resistance of the resistor $R_c$ and, as a result, changes the electrical current $I\_R_c$ flowing through the resistor $R_c$ based on a fixed voltage from the power supply. The change to the electrical current $I\_R_c$ translates into a change to the voltage $V_{OUT\_CSA}$. Accordingly, the controller can monitor changes to the sensed voltage, compare these changes to change thresholds that are defined by a profile to detect the damage, and detect the damage based on the comparison. Upon detection of the damage, the controller can initiate a corrective action (e.g., turning off power the light source).

Figure 13:
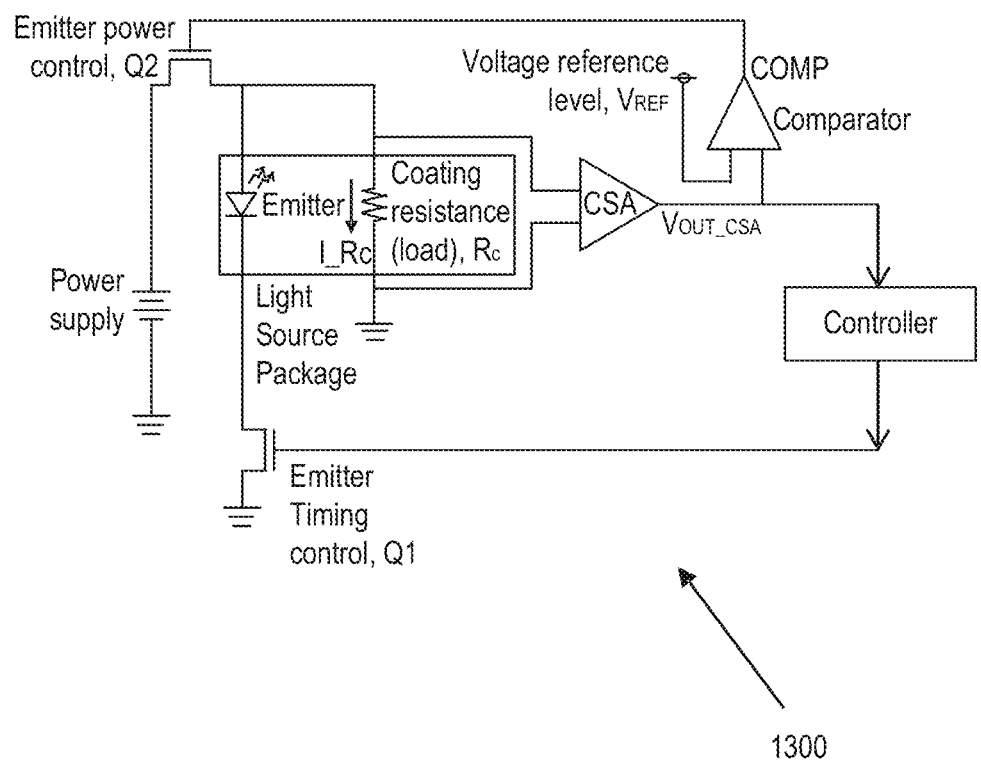
FIG. 13 illustrates an example of a diagram of yet another circuit for detecting damage to an optical element of a light source package and for controlling a light source of the light source package.

FIG. 13 illustrates an example of a diagram of yet another circuit 1300 for detecting damage to an optical element of a light source package and for controlling a light source of the light source package, according to an embodiment of the present disclosure. This circuit 1300 includes components similar to the ones of the circuit 1200 of FIG. 12 (and can additionally or alternatively include components similar to the ones of the circuit 1000 of FIG. 10 or circuit 1100 of FIG. 11). In addition, the circuit 1300 includes a voltage comparator, a voltage reference level and a second field-effect transistor (shown as an emitter power control, Q2). These additional components can replace certain functionalities of the profile discussed in connection with FIG. 10 (e.g., represent a hardware implementation thereof). In particular, rather than having to use change thresholds from the profile, corresponding voltage levels can be set as inputs to the voltage comparator that then enables or disables the light emitter via the second field-effect transistor.

As illustrated, the second field-effect transistor is connected in between the power supply and the light emitter and in between the power supply and the resistor $R_c$ (e.g., electrically conductive material). An input of the voltage comparator is the voltage $V_{OUT\_CSA}$ from the current sense amplifier. Another input to the voltage comparator is the voltage reference level $V_{REF}$.

The voltage comparator compares the two input voltages $V_{OUT\_CSA}$ and $V_{REF}$. If the difference between the voltages $V_{OUT\_CSA}$ and $V_{REF}$ exceeds a difference threshold, the voltage comparator controls the emitter power control, Q2 to stop the power flow from the power supply to the light emitter and the electrically conductive material. For instance, for a certain power flow and for a known resistance of the electrically conductive material (e.g., of the resistor $R_c$), a predefined value for the voltage $V_{OUT\_CSA}$ can be expected. The voltage reference level $V_{REF}$ can be set as a function of this predefined value (e.g., some percentage or margin around this value, where this percentage or margin can be derived from lab experiments to achieve an eye safe level given a specific light source package configuration). Accordingly, as long as the difference between the voltages $V_{OUT\_CSA}$ and $V_{REF}$ falls within the margin, the voltage comparator does not turn off the light emitter. But if this difference exceeds the margin, the light emitter is turned off. Although FIG. 13 illustrates turning off power to both the light emitter and the electrically conductive material, other power controls are possible. For example, the emitter power control, Q2 may be connected to only the light emitter. In this way, the light emitter may be disabled and power to the electrically conductive material may still be supplied, thereby allowing subsequent monitoring of the electrical resistance of the electrically conductive material. In this example, a power latch may also be used to prevent turning back on the power to the light emitter.

In this illustration, the controller can be used to control the modulation of the light emitter via the emitter timing control, Q1. Optionally, the controller can be used to generate a fault report upon detection of the damage by the controller.

FIG. 14 illustrates an example of a diagram of a circuit 1400 for detecting damage to an optical element of a light source package based on a photodiode of the light source package, according to an embodiment of the present disclosure. In this example, the light source package may be similar to the light source package 200 of FIG. 2. The resistor $R_c$ corresponding to a conductive material on the optical element is not shown in FIG. 14. This circuit 1400 is used to determine a change to reflected light from the optical element by monitoring a voltage corresponding to the electrical current converted from the reflected light.

As illustrated, the circuit 1400 includes a light emitter (representing a light source of the light source package), a receiver (representing the photodiode), a transimpedance amplifier, a controller, a field-effect transistor (shown as an emitter timing control, Q1) and a power supply. Similarly to the circuit 1000 of FIG. 10, here the light emitter is connected to the power supply and the field-effect transistor. One side of the receiver is connected to the power supply and the other side of the receiver is connected to the transimpedance amplifier. The transimpedance amplifier is also connected to the power supply. Although the same power supply is connected to the light emitter and the receiver, these electrical components of the light source package can be connected to two different power supplies.

Accordingly, the reflected light is received by the receiver and converted into a photocurrent that the transimpedance amplifier converts to an amplified voltage $V_{OUT\_TIA}$. This analog voltage $V_{OUT\_TIA}$ or a digitally converted voltage (through an analog-to-digital converter (ADC) not shown in FIG. 14) is fed to the controller. Based on a value of the sensed voltage a damage profile accessible to the controller, the controller determines whether damage to the optical element has occurred (and optionally the type of damage) and enables or disables the light emitter's emitter timing control, Q1 and, accordingly, turns on or off the light emitter.

In particular, if the optical element was removed (e.g., is missing), no reflected light would be received. Accordingly, the voltage $V_{OUT\_TIA}$ would drop to zero. The profile can identify that a zero voltage corresponds to a removal of the optical element. Further, if other damages to the optical element occur (e.g., scratch, crack, etc.), the amount of the reflected light will also change relative to the optical element not having any damage. In lab experiments, the reflected light amount can be measured for different type of damages under different operational conditions and can be mapped to voltage levels given specific power supplier and transimpedance configurations, to eye safe levels, and to corrective actions. These voltage levels, along with the corresponding damage types (and, optionally damage locations, sizes, etc.), operational conditions, and corrective actions can be stored in the profile. Hence, when the controller detects that the voltage $V_{OUT\_TIA}$ is zero, the removal of the optical element is detected and the light emitter is turned off. When the controller detects that the voltage $V_{OUT\_TIA}$ changed to one of the mapped voltage levels, the corresponding damage is detected and the corresponding corrective action is initiated.

In an example, the use of a profile may not be needed. For instance, a voltage comparator can be used where the voltage $V_{OUT\_TIA}$ can be set as an input to the voltage comparator.

In addition to detecting damage, the photodiode can be used to detect temperature drift of the light emitter. In particular, temperature changes of the light emitter can be detected due to a change in the output optical power by the light emitter over temperature. The controller can then change the power supply level to compensate for the temperature drift and to keep the output optical power at a constant level. In an example, a temperature sensor, a thermistor, or a second photodiode (not shown in the figures) can be used to detect photodiode change due to damage and photodiode change due to temperature.

Figure 15:
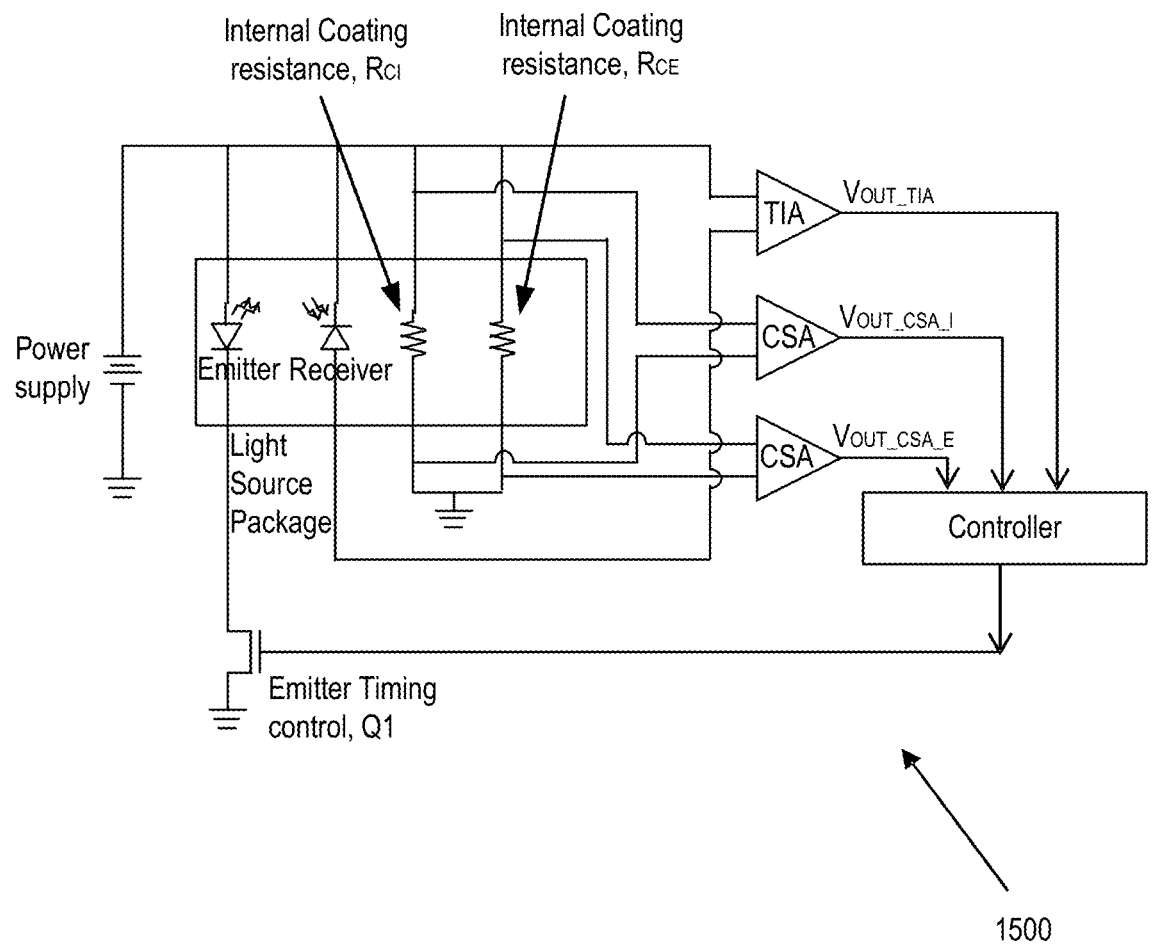
FIG. 15 illustrates an example of a diagram of yet another circuit for detecting damage to an optical element of a light source package and for controlling a light source of the light source package.

FIG. 15 illustrates an example of a diagram of yet another circuit 1500 for detecting damage to an optical element of a light source package and for controlling a light source of the light source package, according to an embodiment of the present disclosure. In this embodiment, the light source includes two optical elements, each having an electrically conductive material, and a photodiode similarly to the light source package of FIG. 9. The circuit 1500 is set-up to monitor voltages associated with the photodiode (e.g., based on the converted photocurrent) and associated with the electrically conductive materials (e.g., based on electrical current flows). In particular, the circuit 1500 can include three sub-circuits: one corresponding to the photodiode, one corresponding to the first electrically conductive material, and one corresponding to the second electrically conductive material. The sub-circuit for monitoring the photodiode can have components similar to the ones of the circuit 1400 of FIG. 14 (e.g., a receiver representing the photodiode and a transimpedance amplifier). Each sub-circuit for monitoring an electrically conductive material can have components similar to the ones of any of circuits 1000-1300 of FIGS. 10-13. Although in the circuit 1500, the same power supply is connected to the light emitter and to each sub-circuit, multiple power supplies can be used instead. Further, if a light source package includes a different number of optical elements and/or photodiode, the circuit 1500 can be modified to include the corresponding sub-circuits.

As illustrated, values of three voltages are provided to the controller: $V_{OUT\_CSA\_E}$ that is associated with the first electrically conductive material on the external optical element, $V_{OUT\_CSA\_I}$ that is associated with the second electrically conductive material on the internal optical element, and $V_{OUT\_TIA}$ that is associated with the photodiode. Based on any or a combination of these voltage values, the controller can detect that one or more damages have occurred and can initiate corrective action(s) including, for instance, turning off the light emitter by controlling the emitter timing control, Q1.

In an example, upon detection of a damage to either the external optical element or the internal optical element based on the value of voltage $V_{OUT\_CSA\_E}$ or the value of voltage $V_{OUT\_CSA\_I}$, respectively, the controller automatically turns off the light emitter. In another example, upon detection of a damage to either the external optical element or the internal optical element based on the value of voltage $V_{OUT\_CSA\_E}$ or the value of voltage $V_{OUT\_CSA\_I}$, respectively, the controller confirms the damage based on the voltage $V_{OUT\_TIA}$. Upon confirming the damage, the controller automatically turns off the light emitter. In yet another example, upon detection of a damage based on the value of voltage $V_{OUT\_TIA}$, the controller automatically turns off the light emitter and then checks the value of voltage $V_{OUT\_CSA\_E}$ or the value of voltage $V_{OUT\_CSA\_I}$ to confirm the damage to either the external optical element or the internal optical element. If the damage is not confirmed, the controller may turn on the light emitter again. In a further example, upon detection of a damage based on the value of voltage $V_{OUT\_TIA}$, the controller automatically increases the rate of monitoring the value of voltage $V_{OUT\_CSA\_E}$ or the value of voltage $V_{OUT\_CSA\_I}$ to then turn off the light emitter as applicable.

Figure 16:
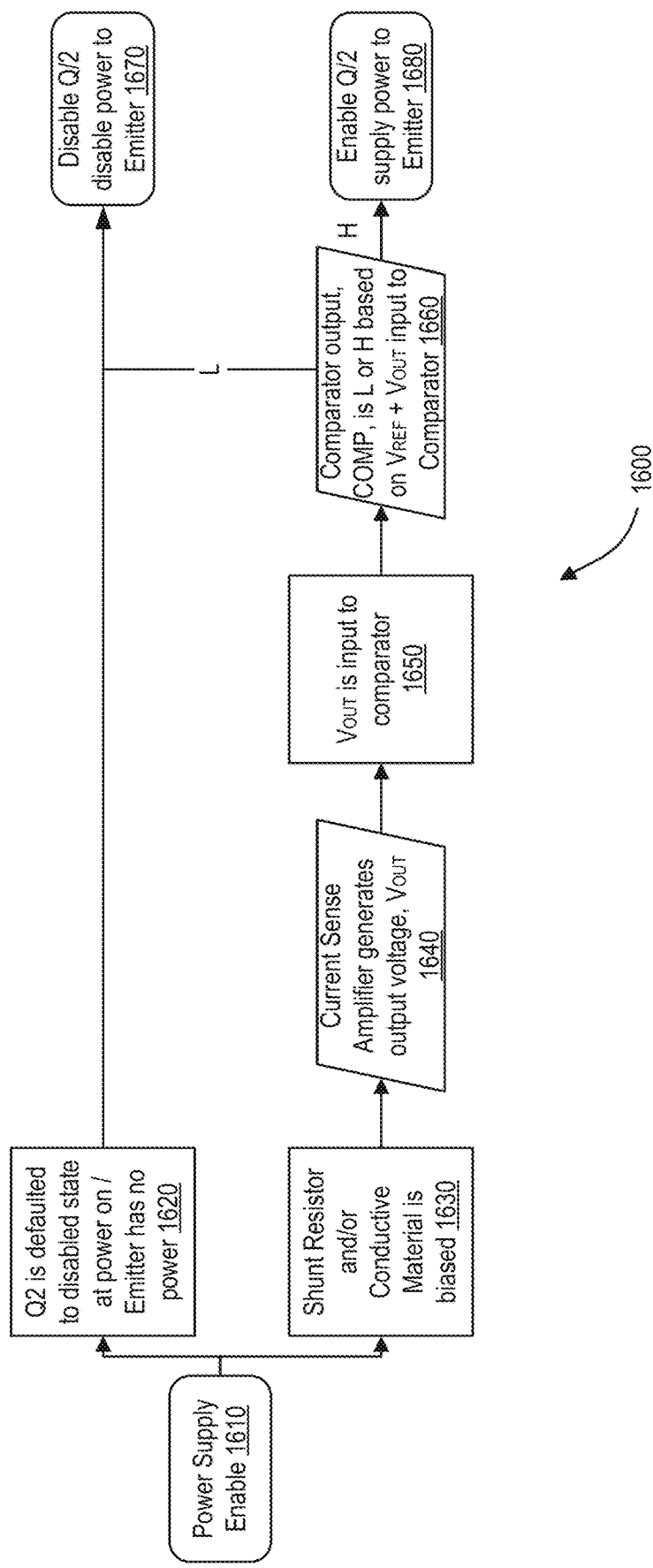
FIG. 16 illustrates an example of a control circuitry flow for detecting damage to an optical element of a light source package based on a voltage comparator.

FIG. 16 illustrates an example of a control circuitry flow 1600 for detecting damage to an optical element of a light source package based on a voltage comparator, according to an embodiment of the present disclosure. The control circuitry flow 1600 can be implemented by using, for example, the circuit 1300 of FIG. 13.

As illustrated, the control circuitry flow 1600 includes enabling 1610 the power supply (e.g., by turning it on). When the power is initially enabled, the emitter power controller, Q2 is defaulted 1620 to a disabled state. In this way, the light emitter is not powered up in case damage to the optical element already exists. The shunt resistor $R_s$ (as in, for instance, the circuit 1000 of FIG. 10) and/or the electrically conductive material (e.g., the resistor $R_c$ as in, for instance, the circuits 1100-1200 of FIGS. 11-12) is also electrically biased 1630 and the current sense amplifier generates 1640 output voltage $V_{OUT}$. This voltage output $V_{OUT}$ is input 1650 to the voltage comparator that then compares 1660 the voltage $V_{OUT}$ to a voltage reference level $V_{REF}$, where the voltage $V_{REF}$ is also an input to the voltage comparator. Based on the comparison, the voltage comparator outputs a value COMP set to low ("L") or high ("H"). The low value "L" indicates that the difference between the voltage $V_{OUT}$ and the voltage reference level $V_{REF}$ is beyond an acceptable operational margin. Conversely, the high value "H" indicates that the difference is within the acceptable operational margin. The emitter power controller, Q2 remains 1670 in the disabled state when the value COMP is set to low "L" to prevent powering on the light emitter. The state of the emitter power controller, Q2 changes 1680 to enabled when the value COMP is set to high "H" to turn on the light emitter. Once in the enabled state, the process of measuring the voltage output $V_{OUT}$ and the comparison to the voltage reference level $V_{REF}$ is repeated to maintain the enabled state in case the difference remains in the acceptable operational margin or, otherwise, to update 1670 this state to disabled.

Figure 17:
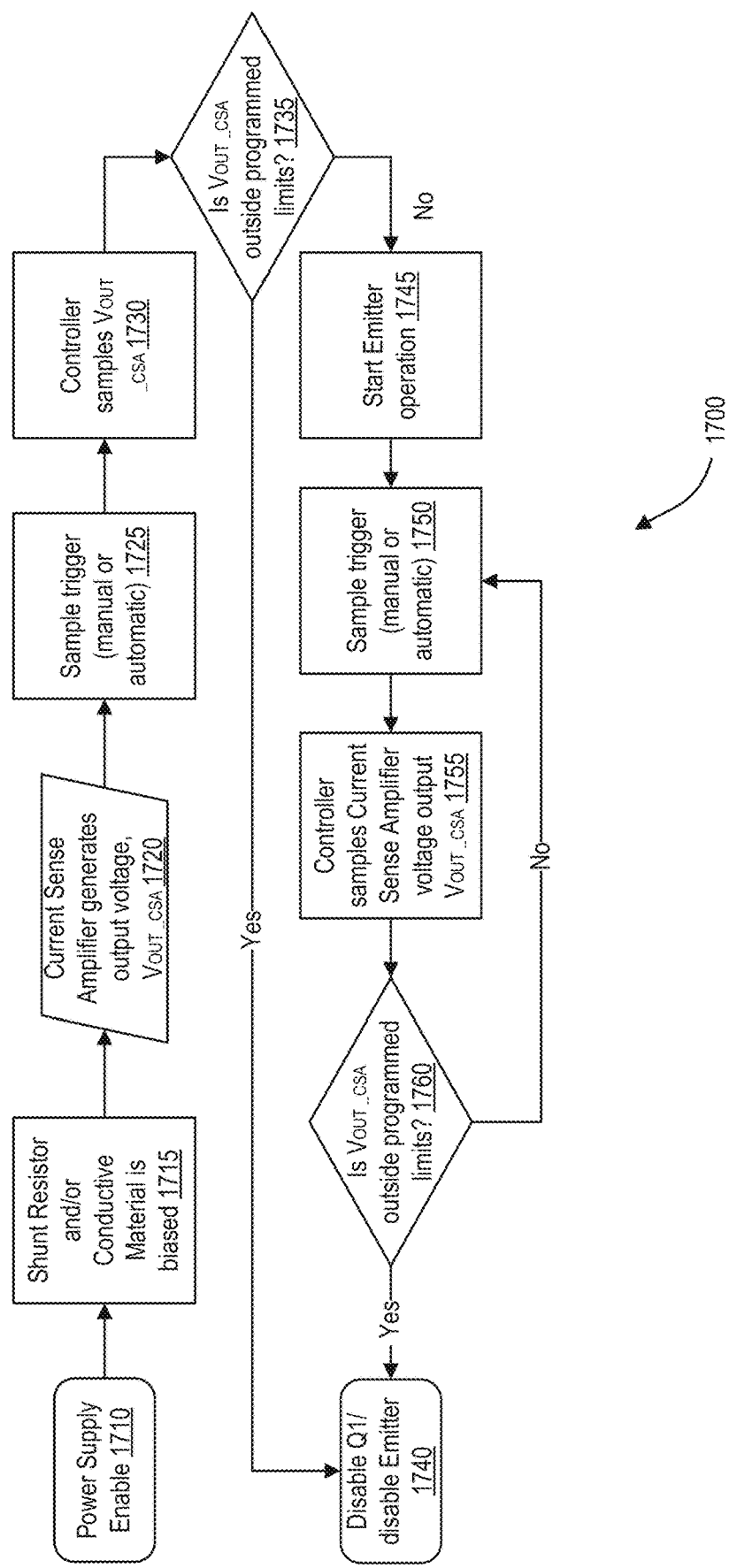
FIG. 17 illustrates an example of a control circuitry flow for detecting damage to an optical element of a light source package based on a profile.

FIG. 17 illustrates an example of a control circuitry flow 1700 for detecting damage to an optical element of a light source package based on a profile, according to an embodiment of the present disclosure. The control circuitry flow 1700 can be implemented, for example, by using a combination of any of the circuits 1000-1200 of FIGS. 10-12.

As illustrated, the control circuitry flow 1700 includes enabling 1710 the power supply (e.g., by turning it on), thereby electrically biasing 1715 the shunt resistor $R_s$ (as in, for instance, the circuit 1000 of FIG. 10) and/or the electrically conductive material (e.g., the resistor $R_c$ as in, for instance, the circuits 1100-1200 of FIGS. 11-12). Next, the current sense amplifier generates 1720 a voltage $V_{OUT\_CSA}$ based on the electrical current flowing through the shunt resistor $R_s$ or the electrically conductive material. The controller receives 1725 a trigger to sample the voltage $V_{OUT\_CSA}$. This trigger can be manual (e.g., based on user input at a light projection system, where the controller is installed). In another example, the trigger can be automatic (e.g., based on a predefined schedule, periodic time intervals, or prior detection of a damage). Based on the trigger, the controller samples 1730 the voltage $V_{OUT\_CSA}$ and determines 1735 whether the sampled voltage is outside programmable limits. These limits could be set as voltage levels, operational voltage range, or change thresholds in the profile accessible to the controller. If the sampled voltage is outside a programmable limit, the emitter timing control, Q1 is disabled 1740, thereby turning off the light emitter. Otherwise, the controller enables 1745 the emitter timing control, Q1, thereby turning on the light emitter. Thereafter, the controller further receives 1750 another trigger (manual or automatic) to sample the voltage $V_{OUT\_CSA}$, indicating a new monitoring cycle. The voltage $V_{OUT\_CSA}$ may have changed over time based on a damage to the conductive material. Next, the controller samples 1755 the voltage $V_{OUT\_CSA}$ and determines 1760 whether the sampled voltage is outside the programmable limits. If so, the emitter timing control, Q1 is disabled 1740, thereby turning off the light emitter. Otherwise, the flow loops back to a next sample trigger 1750 to perform another monitoring cycle.

Figure 18:
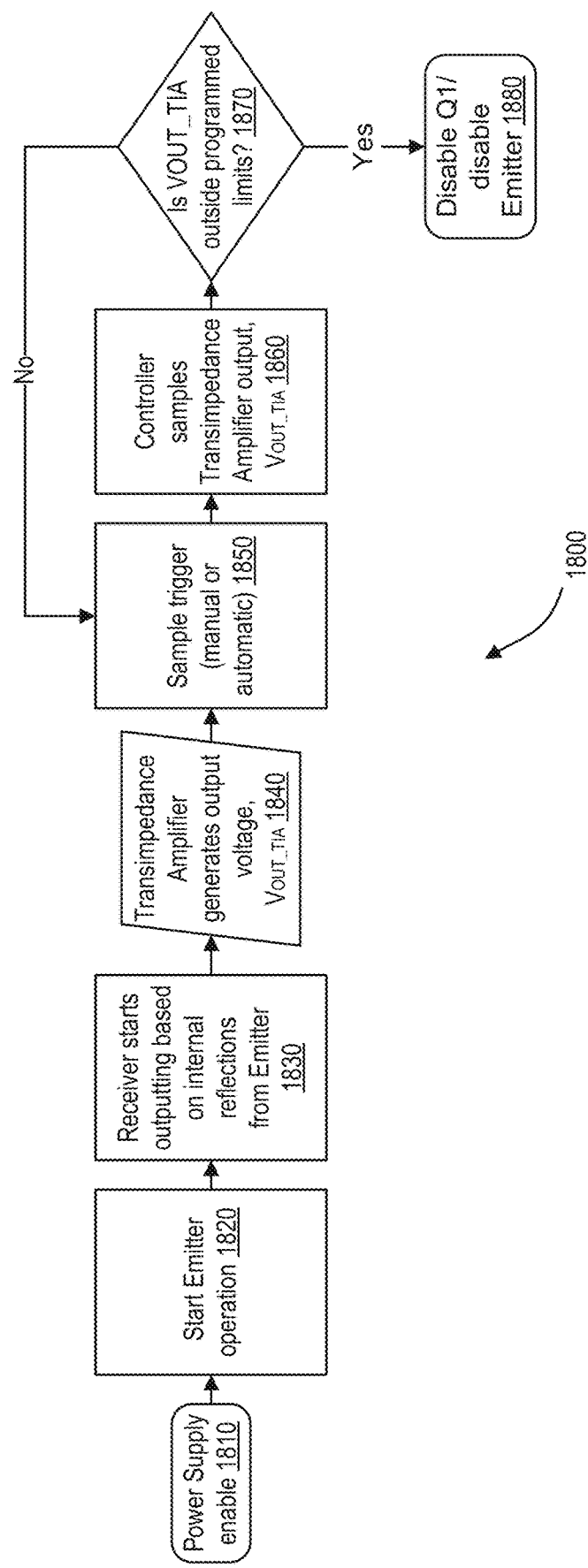
FIG. 18 illustrates an example of a control circuitry flow for detecting damage to an optical element of a light source package based on a photodiode.

FIG. 18 illustrates an example of a control circuitry flow 1800 for detecting damage to an optical element of a light source package based on a photodiode, according to an embodiment of the present disclosure. The control circuitry flow 1800 can be implemented, for example, by using circuit 1400 of FIG. 14.

As illustrated, the control circuitry flow 1800 includes enabling 1810 the power supply (e.g., by turning it on), thereby turning on 1820 the light emitter. The photodiode (e.g., a light receiver) starts outputting 1830 a photocurrent based on a reflection of light emitted from the light emitter. The transimpedance amplifier generates 1840 a voltage $V_{OUT\_TIA}$ based on the photocurrent. The controller receives 1850 a trigger to sample the voltage $V_{OUT\_TIA}$. This trigger can be manual (e.g., based on user input at a light projection system, where the controller is installed). In another example, the trigger can be automatic (e.g., based on a predefined schedule, periodic time intervals, or prior detection of a damage). Based on the trigger, the controller samples 1860 the voltage $V_{OUT\_TIA}$ and determines 1870 whether the sampled voltage is outside programmable limits. These limits could be set as voltage levels, operational voltage ranges, or change thresholds in the profile accessible to the controller. If the sampled voltage is outside a programmable limit, the emitter timing control, Q1 is disabled 1880, thereby turning off the light emitter. Otherwise, the flow loops back to a next sample trigger 1850 to perform another monitoring cycle.

Figure 19:
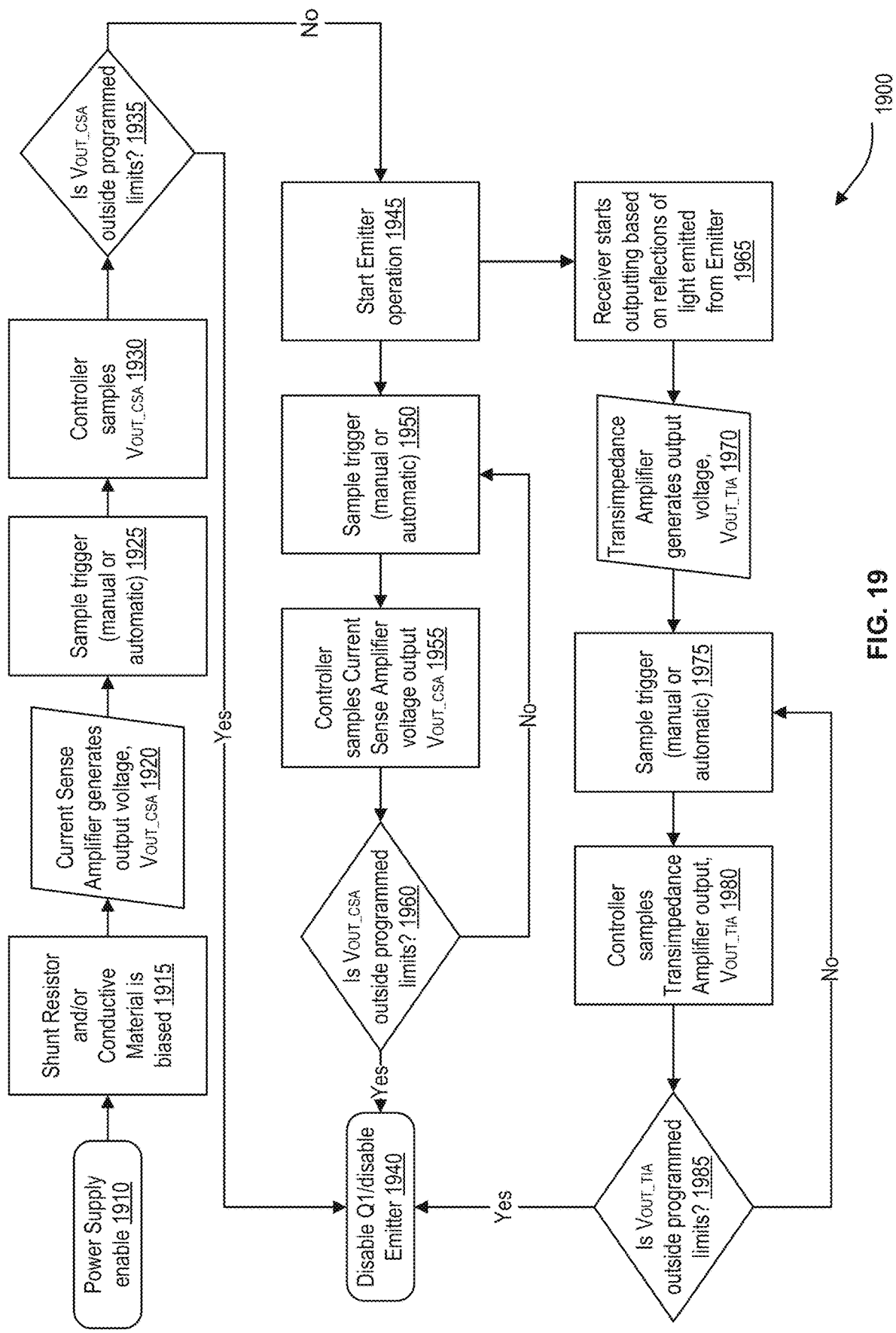
FIG. 19 illustrates an example of a control circuitry flow for detecting damage to an optical element of a light source package based on a profile and a photodiode.

FIG. 19 illustrates an example of a control circuitry flow 1900 for detecting damage to an optical element of a light source package based on a profile and a photodiode, according to an embodiment of the present disclosure. The control circuitry flow 1900 can be implemented, for example, by using a combination of any of the circuits 1000-1200 of FIGS. 10-12 and the circuit 1400 of FIG. 14 or by using the circuit 1500 of FIG. 15 with the corresponding number of sub-circuits.

As illustrated, the control circuitry flow 1900 includes enabling 1910 the power supply (e.g., by turning it on), thereby electrically biasing 1915 the shunt resistor $R_s$ (as in, for instance, the circuit 1000 of FIG. 10) and/or the electrically conductive material (e.g., the resistor $R_c$ as in, for instance, the circuits 1100-1200 of FIGS. 11-12). Next, the current sense amplifier generates 1920 a voltage $V_{OUT\_CSA}$ based on the electrical current flowing through the shunt resistor $R_s$ or the electrically conductive material. The controller receives 1925 a trigger to sample the voltage $V_{OUT\_CSA}$. This trigger can be manual (e.g., based on user input at a light projection system, where the controller is installed). In another example, the trigger can be automatic (e.g., based on a predefined schedule, periodic time intervals, or prior detection of a damage). Based on the trigger, the controller samples 1930 the voltage $V_{OUT\_CSA}$ and determines 1935 whether the sampled voltage is outside programmable limits. These limits could be set as voltage levels, operational voltage range, or change thresholds in the profile accessible to the controller. If the sampled voltage is outside a programmable limit, the emitter timing control, Q1 is disabled 1940, thereby turning off the light emitter. Otherwise, the controller enables the emitter timing control, Q1, thereby turning on 1945 the light emitter. Once the light emitter is turned on, further damage detection can be performed based on monitoring the electrically conductive material and the photodiode as indicates by the arrows to blocks 1950 and 1965.

Specific to the electrically conductive material monitoring, the controller further receives 1950 another trigger (manual or automatic) to sample the voltage $V_{OUT\_CSA}$ that is an output of the current sense amplifier and that may have changed over time based on a damage to the conductive material. Next, the controller samples 1955 this voltage $V_{OUT\_CSA}$ and determines 1960 whether the sampled voltage is outside the programmable limits. If so, the emitter timing control, Q1 is disabled 1940, thereby turning off the light emitter. Otherwise, the flow loops back to a next sample trigger to perform another cycle of electrically conductive material monitoring.

Specific to the photodiode monitoring, the photodiode (e.g., a light receiver) starts outputting 1965 a photocurrent based on a reflection of light emitted from the light emitter. The transimpedance amplifier generates 1970 a voltage $V_{OUT\_TIA}$ based on the photocurrent and the controller further receives 1975 a trigger (manual or automatic) to sample the voltage $V_{OUT\_TIA}$. Next, the controller samples 1980 this voltage $V_{OUT\_TIA}$ and determines 1985 whether the sampled voltage is outside programmable limits (also available from the profile). If so, the emitter timing control, Q1 is disabled 1940, thereby turning off the light emitter.

Otherwise, the flow loops back to a next sample trigger to perform another cycle of photodiode monitoring.

Although a profile is described in connection with FIG. 19 under blocks 1935, 1960, and 1985 to determine whether a sensed voltage (e.g., $V_{OUT\_CSA}$ or $V_{OUT\_TIA}$) is within programmable limits representing operational ranges, the flow 1900 of FIG. 19 can be similarly used with a voltage comparator. In particular, rather than storing the programmable limits in the profile, these limits can be set as voltage references that are input to one or more voltage comparators. An output of a voltage comparator would indicate if a sensed voltage (e.g., $V_{OUT\_CSA}$ or $V_{OUT\_TIA}$) is within an acceptable operational range. This output is then used to disable the emitter timing control, Q1 accordingly under block 1940.

FIGS. 20-23 illustrate examples of flows for monitoring damage associated with a light source package and controlling a light source of the light source package based on a detected damage. A light projection system, such as the light projection system 100 of FIG. 1, may be configured to perform the illustrative flows in some embodiments. The light source package may be provided as a component of the light projection system. Some or all of instructions for performing the operations of the illustrative flows can be implemented as hardware circuitry and/or stored as computer-readable instructions on a non-transitory computer-readable medium of the light projection system. As implemented, the instructions represent modules that include circuitry or code executable by a processor(s) of the light projection system. The use of such instructions configures the light projection system to perform the specific operations shown in the figures and described herein. Each circuitry or code in combination with the processor represents a means for performing a respective operation(s). While the operations are illustrated in a particular order, it should be understood that no particular order is necessary and that one or more operations may be omitted, skipped, and/or reordered. Further, some of the operations are similar between the flows. The similarities are not repeated.

Figure 20:
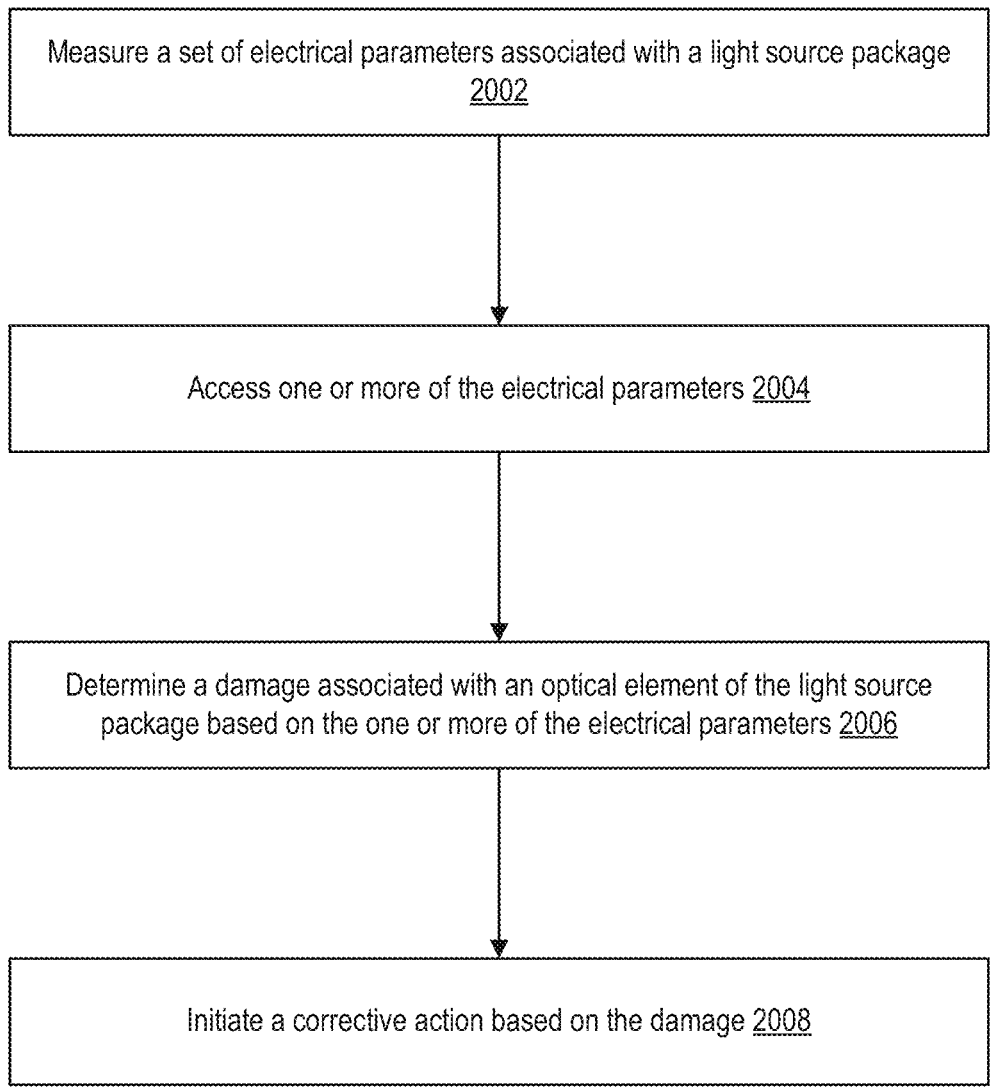
FIG. 20 illustrates an example of a flow for monitoring damage and controlling a light source of a light source package based on a set of electrical parameters.

FIG. 20 illustrates an example of a flow for monitoring damage and controlling a light source of a light source package based on a set of electrical parameters, according to an embodiment of the present disclosure. The flow starts at operation 2002, where the light projection system may measure the set of electrical parameters associated with the light source. In an example, the light source package includes a number of optical elements and a photodiode. At least one of the optical elements (e.g., the external optical element) includes an electrically conductive material (e.g., an ITO coating or film attached to the external surface of this optical element). The set includes electrical parameters measurable for the electrically conductive material(s) and the photodiode. For instance and for an electrically conductive material, this set includes any of a resistance of the electrically conductive material, a voltage across ends of the electrical conductive material, or a current through the electrically conductive material. For the photodiode, the set includes any of a photocurrent output from the photodiode based on light, or a voltage generated based on the photocurrent. The light source package also includes sensor system(s) that measure the set of the electrical parameters. Accordingly at operation 2002, a sensor system measures an electrical parameter of an electrically conductive material on an external surface of an optical element of the light source package. The same or a different sensor system measures an electrical parameter of the photodiode. If the light source package includes a second optical element having a second electrically conductive material, the same or a different sensor system also measures a second electrical parameter of the second electrically conductive material.

At operation 2004, the light projection system may access one or more of the electrical parameters from the measured set. In an example, a controller of the light projection system receives a value of the electrical parameter of the electrically conductive material and, as applicable the second electrical parameter of the second electrically conductive material. Optionally, the controller receives the electrical parameter of the photodiode. The access can be based on a manual trigger or an automatic trigger or can be continuous. These electrical parameters may be provided from the sensor system(s) to the controller or may be stored in a memory of the light projection system. In another example, a comparator (e.g., a voltage comparator) in a sensor system receives the corresponding electrical parameter (e.g., voltage) sensed by the sensor system.

At operation 2006, the light projection system determines a damage associated with the optical element based on the value of the electrical parameter of the electrically conductive material disposed over the external surface of this optical element. Determining the damage may include determining an actual damage or a potential for a damage. Different types of damages may be determined including, for instance, removal of the optical element, scratch to the optical element, a crack in the optical, or another damage that may impact the optical property of the optical element.

In an example, the controller of the light projection system determines the damage based on detecting a change to the electrical resistance of the electrically conductive material, comparing the change to a threshold, and determining that the optical element is damaged based on the comparison (e.g., based on the change being larger than a threshold). For instance, the electrical parameter includes a voltage generated based on a current flow through the electrically conductive material. The controller monitors this voltage over time by comparing sampled values of the voltage to one or more voltage levels defined in a profile. If the comparison indicates that the voltage changed beyond a change threshold or has become outside of an acceptable operational range, the controller determines the damage.

Optionally, the controller also receives a value of the electrical parameter associated with the photodiode. The controller may do so to confirm the detected damage. Here also, if the value of this electrical parameter changed beyond a change threshold or has become outside of an acceptable operational range, the controller confirms the damage.

Furthermore, if the light source package includes the second optical element, the controller may also detect damage to this optical element based on the value of the second electrical parameter. If any of the optical elements has been damaged, the controller determines that a corrective action should be initiated to prevent an unsafe eye condition.

In another example, the comparator is used to detect the damage. In particular, the comparator can compare any of the electrical parameters (e.g., any of the voltages) to predefined reference levels. If the comparison indicates that the electrical parameter(s) is outside an acceptable operational range, the corrective action should be initiated.

At operation 2008, the light projection system imitates the corrective action based on the damage detected for any of the optical elements and, optionally, confirmed based on the electrical parameter of the photodiode. In an example, the controller turns off the light source of the light source package or may decrease the intensity of the light emitted by the light source. In addition, the controller can generate a fault report and turn on another light source in a redundant light source package, as applicable.

Figure 21:
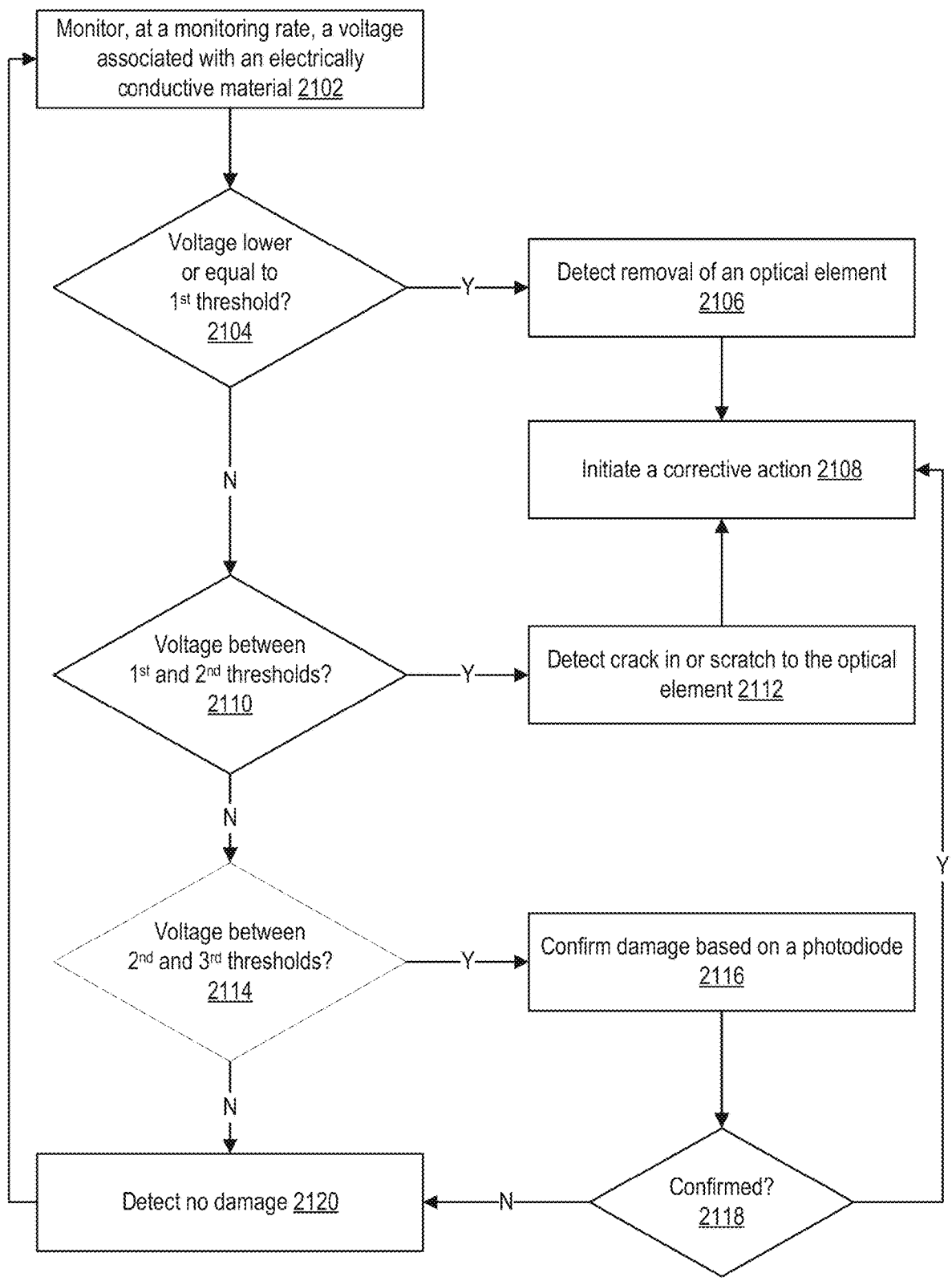
FIG. 21 illustrates an example of a flow for monitoring a damage and controlling a light source of a light source package based on a change to an electrically conductive material and a photodiode.

FIG. 21 illustrates an example of a flow for monitoring a damage and controlling a light source of a light source package based on a change to an electrically conductive material and a photodiode, according to an embodiment of the present disclosure. In the interest of clarity of explanation, the flow is described in connection with using voltages. However, the flow similarly applies for other electrical parameters.

The flow starts at operation 2102, where the light projection system may monitor, at a monitoring rate, a value of a voltage associated with an electrically conductive material. In an example, the electrically conductive material is on an external surface of an optical element of the light source package. The monitoring rate can correspond to a manual or automatic trigger. If an automatic trigger is used, the monitoring rate can increase based on a past detection of the damage. For instance, if the optical element was detected to be damaged but this damage does not necessitate the power to be turned off to the light source, the monitoring rate can be increased to more frequently determine whether the damage has further changed such that the power should be turned off. To do so, the value of the voltage can be compared to operational ranges associated damage types and monitoring rates. If the past detection of the voltage value indicates that the voltage is outside a first predefined operational voltage range and inside a second predefined operational range, a corrective action associated with the second may include increasing (e.g. doubling) the monitoring rate.

At operation 2104, the light projection system may determine whether the voltage (e.g., the monitored value of the voltage) is lower or equal to a first threshold. In an example, this first threshold is defined to be a small value close to zero. Accordingly, if the voltage drops to zero, a determination may be made at operation 2106 that the optical element was removed because electrical current is no longer flowing through the electrically conductive material. At operation 2108, the light projection system may initiate a corrective action that includes, for instance, turning off the light source and reporting the removal (e.g., detachment) of the optical element. If the voltage exceeds the first threshold, operation 2110 may be performed.

At operation 2110, the light projection system may determine whether the voltage (e.g., the monitored value of the voltage) is between the first threshold and a second threshold. In an example, the second threshold is larger than the first threshold and is set as a value associated with an unsafe eye condition. If so, a determination may be made at operation 2112 that the optical element may have been scratched or cracked and, thus, may no longer be safe to use. Operation 2108 may follow operation 2112, where the light projection system may initiate a corrective action that includes, for instance, turning off the light source and reporting the crack or scratch. If the voltage exceeds the second threshold, operation 2114 may be performed.

At operation 2114, the light projection system may determine whether the voltage e.g., the monitored value of the voltage) is between the second threshold and a third threshold. In an example, the third threshold is larger than the second threshold and is set as a value associated with a safe eye condition. If so, a determination may be made that the optical element has likely been damaged. Operation 2116 may follow operation 2114 to confirm the damage. Otherwise, operation 2120 may follow operation 2114.

At operation 2116, the light projection system accesses a value of a voltage associated with a photocurrent of the photodiode and compares this voltage value to predefined ranges. In an example, a first range may be an operational range defined in part by a third threshold (e.g., a lower bound of this range). A second range may be defined by the third threshold (e.g., an upper bound of this range) and a fourth threshold (e.g., a lower bound of the range). A third range may be defined by the fourth threshold (e.g., an upper bound of this range). The third threshold is associated with a change to the optical property of the optical element, and the fourth threshold is associated with a removal of the optical element from the light source package. Accordingly in this example, if value of the voltage falls within the first range, no damage to the optical element can be detected based on the photodiode. If the value falls within the second range (e.g., between the third and fourth threshold), the damage to the optical element may be confirmed to be the change to its optical property. If the value falls within the third range, the damage may be confirmed to be the removal of the optical element from the light source package. At operation 2118, if this voltage value is outside the operational range, the damage is confirmed and a corrective action is initiated at operation 2108, including turning off the light source and reporting that the type of damage is unknown, but its existence confirmed. Otherwise, the voltage is within the operational range and the damage is not confirmed. In this case, the monitoring rate may be increased and operation 2120 may follow operation 2118.

At operation 2120, the light projection system may determine that no damage exists. Accordingly, the corrective action is not initiated and operation 2102 may follow operation 2120 to keep monitoring the voltage at the monitoring rate.

Although the flow of FIG. 21 describes using the photodiode for confirming the likely damage, the photodiode can also be used to confirm the removal (e.g., at operation 2106) and the scratch or crack (e.g., at operation 2112). In an example, if the removal is detected, light is no longer reflected from the optical element. Accordingly, the photocurrent generated by the photodiode and the associated voltage drop to zero. Hence, if the voltage associated with the photodiode is measured to be less than the first threshold, the light projection system can confirm the removal of the optical element. In another example, the scratch would impact the optical property of the optical element differently from the crack. Accordingly, the reflected light from the optical element with a scratch would be different from the reflected light from the optical element with a crack. Equivalently, the photocurrent and the voltage when a scratch exists would be different from the photocurrent and the voltage when a crack exists. Accordingly, voltage levels may be defined for the scratches and cracks. The voltage associated with the photocurrent may be compared to the voltage levels to, first, confirm that a damage exists and, second, determine whether the damage is a scratch or a crack.

Figure 22:
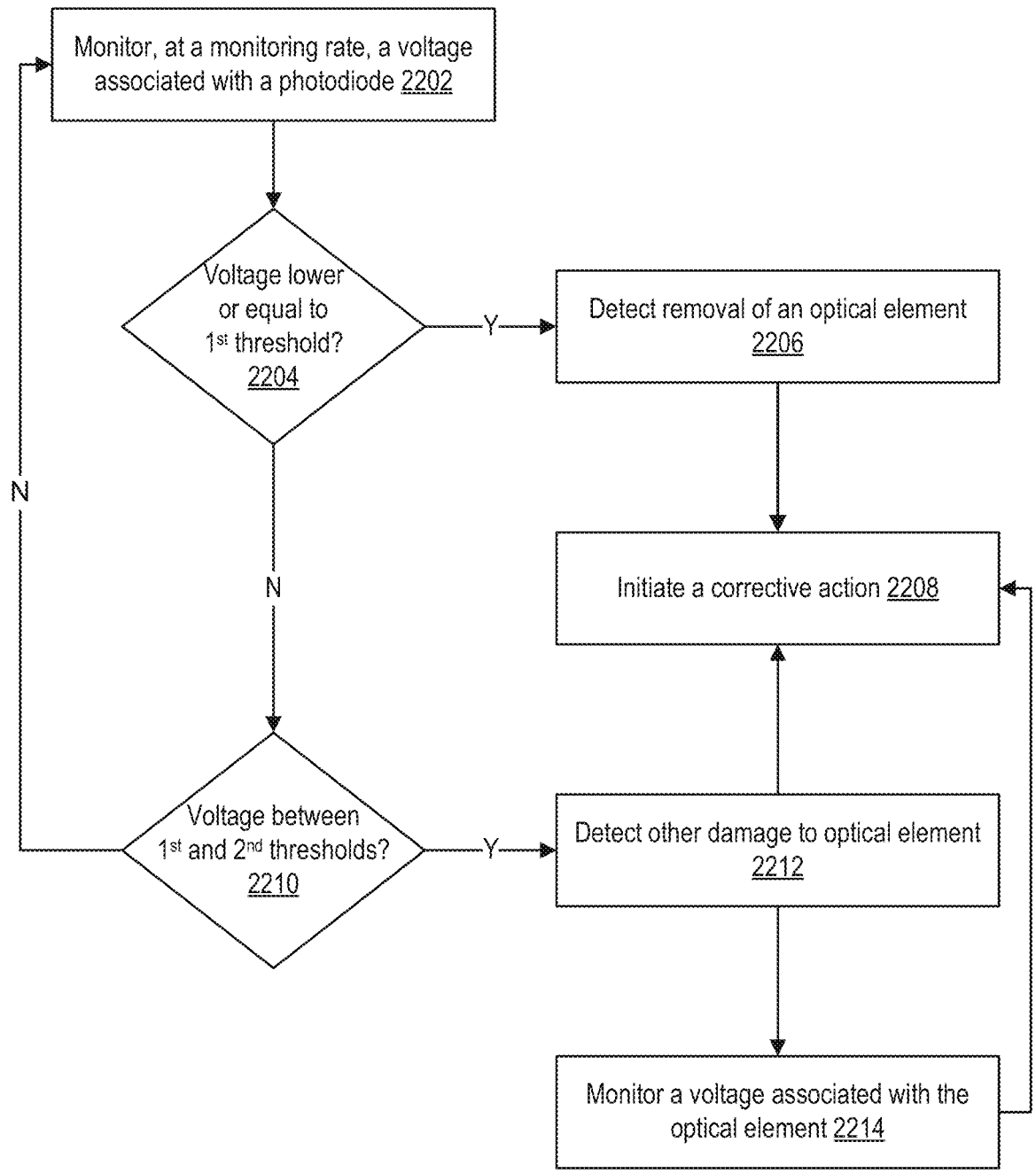
FIG. 22 illustrates an example of a flow for monitoring a damage and controlling a light source of a light source package based on a photodiode.

FIG. 22 illustrates an example of a flow for monitoring a damage and controlling a light source of a light source package based on a photodiode, according to an embodiment of the present disclosure. In the interest of clarity of explanation, the flow is described in connection with using voltages. However, the flow similarly applies for other electrical parameters.

The flow starts at operation 2202, where the light projection system may monitor, a value of a voltage associated with the photodiode. In an example, this voltage corresponds to the photocurrent generated by the photodiode in response to light reflected from an optical element of the light source package.

At operation 2204, the light projection system may determine whether the voltage (e.g., the monitored value of the voltage) is lower or equal a first threshold. In an example, this first threshold is defined to be a small value close to zero. Accordingly, if the voltage drops to zero, a determination may be made at operation 2206 that the optical element was removed because the photodiode no longer generates a photocurrent (i.e., the photocurrent is zero). At operation 2208, the light projection system may initiate a corrective action that includes, for instance, turning off the light source and reporting the removal (e.g., detachment) of the optical element. If the voltage exceeds the first threshold, operation 2210 may be performed.

At operation 2210, the light projection system may determine whether the voltage (e.g., the monitored value of the voltage) is between the first threshold and a second threshold. In an example, the second threshold is larger than the first threshold and is set as a value associated with a misalignment of the optical element relative to the light source. If so, a determination may be made at operation 2212 that the optical element may have been have been damaged (other than the removal from the light source package) and, thus, may no longer be safe to use. Operation 2208 may follow operation 2212, where the light projection system may initiate a corrective action that includes, for instance, turning off the light source and reporting the damage. If the voltage exceeds the second threshold, operation 2202 may follow operation 2210 to keep monitoring the voltage.

Operation 2214, may also follow operation 2212 to further determine the damage. At operation 2214, the light projection system may monitor a value of the voltage associated with the optical element. If that voltage value is outside an operational range, the light projection system may determine that the optical element has been scratched or cracked and may initiate a corrective action at operation 2208 including, for instance, reporting the scratch or crack. If the voltage value is within the range, no change has occurred to the electrically conductive material on the external surface of the optical element. thus, any damage detected at operation 2212 based on the photodiode may have a cause other than a scratch or a crack and may include, for instance, a misalignment of the optical element, a change in the light emitter power due to temperature, or a delamination of a polymer material on an internal surface of the optical element.

Figure 23:
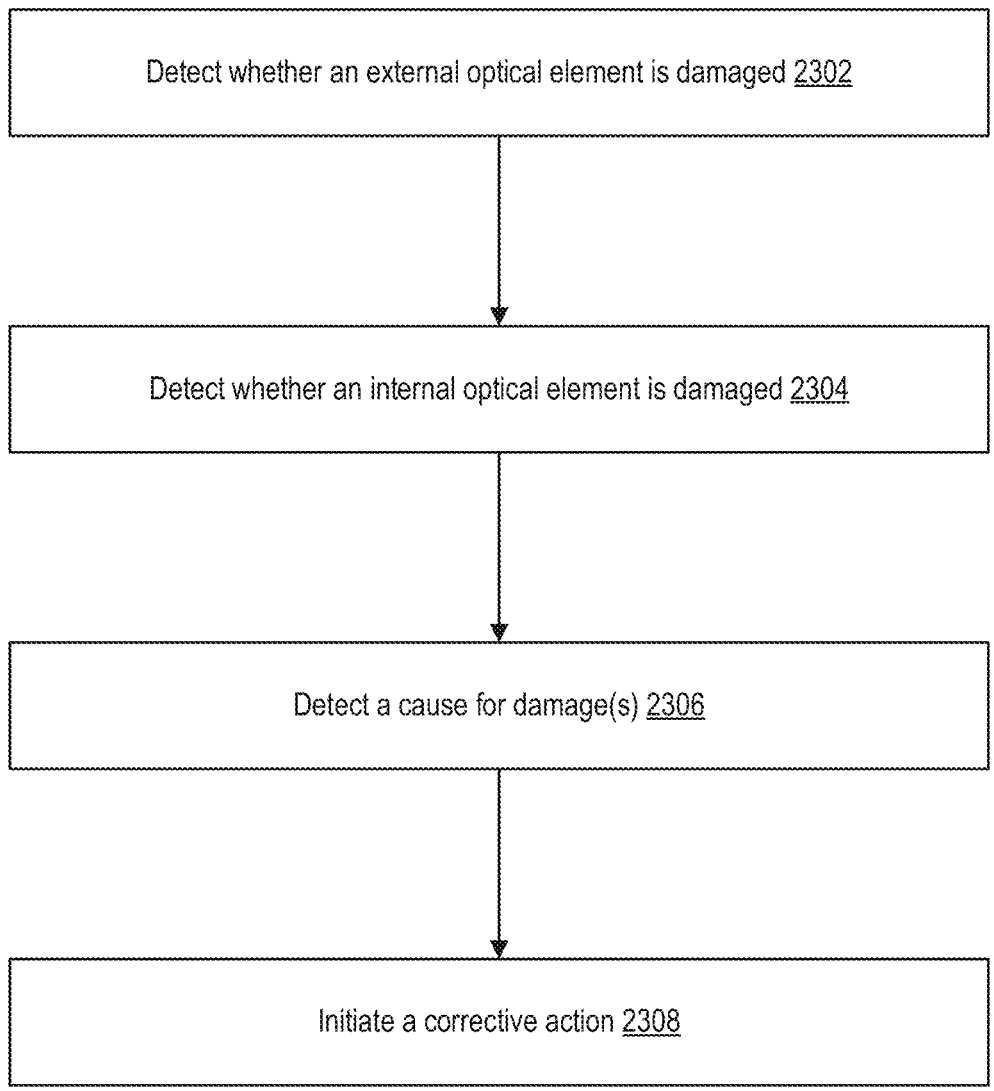
FIG. 23 illustrates an example of a flow for monitoring damages and controlling a light source of a light source package based on multiple electrically conductive materials.

FIG. 23 illustrates an example of a flow for monitoring damages and controlling a light source of a light source package based on multiple electrically conductive materials, according to an embodiment of the present disclosure. In the interest of clarity of explanation, the flow is described in connection with using voltages. However, the flow similarly applies for other electrical parameters.

The flow starts at operation 2302, where the light projection system may detect whether an external optical element of the light source package is damaged. In an example, a first electrically conductive material is on the external optical element. The light projection system monitors a first voltage associated with this first electrically conductive material to detect a first damage to the external optical element.

At operation 2304, the light projection system may detect whether an internal optical element of the light source package is damaged. Similarly herein, a second electrically conductive material is on the internal optical element. The light projection system monitors a second voltage associated with this second electrically conductive material to detect a second damage to the internal optical element.

At operation 2304, the light projection system may determine a cause for the damage(s) if existent. In an example, the cause may depend on the detected damage(s). For instance, if the first damage is a removal of the optical element from the light source package and if the second damage exists, a determination may be made that the two damages were caused by an external mechanical force that was applied to both optical elements. If the first optical element is not damaged but the second one is, a determination may be made that the second damage was caused by a temperature stress or a vibration to the light source package.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Preferred embodiments of this disclosure are described herein, including the best mode known to the inventors for carrying out the disclosure. Variations of those preferred embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

All references, including publications, patent applications, and patents, cited herein are hereby incorporated by reference to the same extent as if each reference were individually and specifically indicated to be incorporated by reference and were set forth in its entirety herein.

What is claimed is:

1. An optical projection system comprising:
    a substrate;
    a light source package comprising:
        a package body comprising a set of walls that are disposed along a first direction and that define an opening, a base that extends from the set of walls along a second direction and that is mounted to the substrate, a substrate interface disposed on an external surface of the base and that is electrically coupled to the substrate, and a conductive path that is electrically coupled to the substrate interface, the conductive path comprising a first portion disposed on the external surface of the base and electrically coupled to the substrate interface, the conductive path further comprising a second portion disposed on a surface of a wall of the set of walls;
        a laser diode disposed on an internal surface of the base and electrically coupled to the substrate via the substrate interface;
        a diffuser that occupies at least a portion of the opening of the package body and that is optically transparent to light emitted from the laser diode, the diffuser including an internal surface facing the laser diode and an opposing external surface; and
        an indium tin oxide (ITO) layer that is disposed over the external surface of the diffuser and that is electrically coupled to the substrate interface via the conductive path; and
    a controller electrically coupled to the ITO layer and configured to:
        detect a change in electrical resistance of the ITO layer;
        determine that the change is larger than a threshold;
        determine that the diffuser is damaged based at least in part on the change being larger than the threshold; and
        turn off power to the laser diode based at least in part on the diffuser being damaged.

2. The optical projection system of claim 1, wherein the light source package further comprises a photodiode electrically and a transimpedance amplifier (TIA) that are electrically coupled to the substrate, wherein:
    the photodiode is configured to output an electrical current based at least in part on reflected light from the internal surface of the diffuser,
    the TIA is configured to convert the electrical current to a voltage, and
    the controller is further configured to receive a value of the voltage and confirm that the diffuser is damaged based at least in part on the value of the voltage.

3. The optical projection system of claim 1, wherein the light source package further comprises (a) a photodiode electrically and a transimpedance amplifier (TIA) that are electrically coupled to the substrate and (b) a collimating lens contained in the package body and disposed between the laser diode and the diffuser, wherein:
    the photodiode is configured to output an electrical current based at least in part on reflected light from the internal surface of the diffuser,
    the TIA is configured to convert the electrical current to a voltage, and
    the controller is further configured to receive a value of the voltage; and
    determine a damage to the collimating lens based at least in part on the value of the voltage.

4. A light source package comprising:
    a package body defining an interior volume and comprising an opening, a base opposite to the opening, a substrate interface included on an external surface of the base and outside the package body, and a conductive path electrically coupled to the substrate interface;
    a light source disposed inside the interior volume on an inside surface of the base, the inside surface being opposite to the external surface, the light source electrically coupled to the substrate interface and configured to emit light;
    an optical element that occupies at least a portion of the opening of the package body, the optical element comprising a surface that is optically transparent to the light; and
    an electrically conductive material disposed over the surface of the optical element and electrically coupled to the substrate interface via the conductive path.

5. The light source package of claim 4, further comprising a second optical element and a photodiode disposed inside the interior volume of the package body, and wherein the second optical element is disposed between the light source and the optical element.

6. The light source package of claim 4, wherein the substrate interface comprises a plurality of electrical connection points, wherein the light source is electrically coupled with a first connection point of the plurality of electrical connection points, wherein the electrically conductive material is electrically coupled with a second connection point of the plurality of electrical connection points, the light source package further comprising:
    a second optical element contained in the package body between the light source and the optical element; and
    a second electrically conductive material that extends across a surface of the second optical element, the second electrically conductive material is electrically coupled with a third connection point of the plurality of electrical connection points.

7. The light source package of claim 4, wherein the substrate interface comprises a plurality of electrical connection points, wherein the conductive path is electrically coupled to a first electrical point of the plurality of electrical connection points; and
    wherein the light source is also electrically coupled to a second electrical connection point of the plurality of electrical connection points.

8. The light source package of claim 7, wherein the conductive path comprises terminal plating on the external surface and at least one of: an electrically conductive tape, an electrically conductive die bond paste, wiring, or a solder that electrically couples the electrically conductive material to the terminal plating on the external surface of the package body.

9. The light source package of claim 4, wherein the electrically conductive material is electrically coupled to a power supply and a controller, wherein the controller is configured to:
- detect a change to an electrical parameter of the electrically conductive material based at least in part on power supplied from the power supply to the electrically conductive material;
- determine that the change is larger than a threshold;
- determine that the optical element is damaged based at least in part on the change being larger than the threshold; and
- initiate a corrective action based at least in part on the optical element being damaged.

10. The light source package of claim 9, wherein the electrical parameter comprises a voltage, wherein to determine that the optical element is damaged, the controller is further configured to determine a damage to the optical element from a profile based at least in part on a value of the voltage, wherein the profile associates voltage ranges with damages.

11. The light source package of claim 10, wherein to initiate the corrective action, the controller is further configured to determine the corrective action from the profile, wherein the profile further associates the damages with corrective actions, and wherein the corrective actions comprise turning off power to the light source, reducing an amount of the power provided to the light source, or generating a fault report.

12. The light source package of claim 7, wherein the light source is electrically coupled to a power supply, wherein the electrically conductive material is electrically coupled to a voltage comparator, wherein the voltage comparator is configured to compare a voltage associated with the electrically conductive material to a voltage reference level and output a value of the compare, and wherein power provided from the power supply to the light source is turned off based at least in part on the value of the compare.

13. The light source package of claim 4, wherein the electrically conductive material is disposed over an external surface of the optical element, and further comprising:
- a second optical element that comprises a second surface that is optically transparent to the light; and
- a second electrically conductive material that is disposed over the second surface of the second optical element.

14. A device comprising:
a light source package comprising:
- a package body defining an interior volume and comprising an opening, a base opposite to the opening, a substrate interface included on an external surface of the base and outside the package body, and a conductive path electrically coupled to the substrate interface;
- a light source disposed inside the interior volume of the package body on an inside surface of the base, the inside surface being opposite to the external surface, the light source electrically coupled to the substrate interface and configured to emit light;
- an optical element that occupies at least a portion of the opening of the package body, the optical element comprising a surface that is optically transparent to the light; and
- an electrically conductive material disposed over the surface of the optical element and electrically coupled to the substrate interface via the conductive path; and
a controller electrically coupled to the substrate interface and configured to detect a damage to the optical element based at least in part on a change to an electrical parameter of the electrically conductive material.

15. The device of claim 14, wherein the electrically conductive material comprises and indium tin oxide (ITO) layer, and wherein the controller is further configured to turn off power to the light source based at least in part on the damage.

16. The device of claim 14, wherein the electrical parameter is at least one of a resistance of the electrically conductive material, a voltage across the electrical conductive material, or a current through the electrically conductive material, and wherein the controller is configured to detect the damage by at least that a value of the electrical parameter is outside a predefined operational range.

17. The device of claim 14, wherein the controller is further configured to:
- monitor the electrical parameter at a monitoring rate; and
- increase the monitoring rate based at least in part on a value of the electrical parameter being outside a predefined operational range.

18. The device of claim 14, wherein the controller is further configured to:
- determine whether a value of the electrical parameter is below a first threshold or falls between the first threshold and a second threshold; and
- upon a determination that the value falls between the first threshold and the second threshold, determine that an optical property of the optical element changed.

19. The device of claim 14, wherein the package body comprises a photodiode, and wherein the controller is further configured to:
- receive a value of a second electrical parameter associated with the photodiode, wherein the value is measured based at least in part on the photodiode sensing light reflected from the optical element;
- determine the damage based at least in part on the value; and
- determine, based at least in part on a comparison of the value to thresholds associated with damage types, that a type of the damage comprises at least one of: a change to an optical property of the optical element or a removal of the optical element.

20. The light source package of claim 4, wherein the package body comprises a set of walls that are disposed along a first direction and that define the opening, wherein the base extends from the set of walls along a second direction and wherein the conductive path comprises a first portion disposed on the base and a second portion disposed on a surface of a wall of the set of walls.

* * * * *